United States Patent
Kadota

(10) Patent No.: US 8,304,959 B2
(45) Date of Patent: Nov. 6, 2012

(54) SURFACE ACOUSTIC WAVE DEVICE

(75) Inventor: Michio Kadota, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/424,462

(22) Filed: Mar. 20, 2012

(65) Prior Publication Data

US 2012/0176001 A1    Jul. 12, 2012

Related U.S. Application Data

(63) Continuation of application No. PCT/JP2010/066426, filed on Sep. 22, 2010.

(30) Foreign Application Priority Data

Sep. 25, 2009  (JP) ................................. 2009-220910

(51) Int. Cl.
H01L 41/08    (2006.01)
(52) U.S. Cl. ................. 310/313 A; 310/313 R
(58) Field of Classification Search .............. 310/313 A, 310/313 B, 313 R
See application file for complete search history.

(56) References Cited

U.S. PATENT DOCUMENTS

| | | | |
|---|---|---|---|
| 5,565,725 A | 10/1996 | Nakahata et al. | |
| 6,259,186 B1 | 7/2001 | Shibata et al. | |
| 6,933,810 B2 * | 8/2005 | Miura et al. | 333/193 |
| 2004/0226162 A1 * | 11/2004 | Miura et al. | 29/594 |
| 2004/0233017 A1 * | 11/2004 | Iwashita et al. | 333/193 |
| 2010/0013894 A1 * | 1/2010 | Ueno et al. | 347/72 |

FOREIGN PATENT DOCUMENTS

| | | |
|---|---|---|
| JP | 8-32398 A | 2/1996 |
| JP | 8-316781 A | 11/1996 |
| JP | 9-208399 A | 8/1997 |
| JP | 10-322158 A | 12/1998 |
| JP | 2000-332314 A | 11/2000 |
| WO | 98/56109 A1 | 12/1998 |

OTHER PUBLICATIONS

Official Communication issued in International Patent Application No. PCT/JP2010/066426, mailed on Dec. 14, 2010.

* cited by examiner

*Primary Examiner* — Mark Budd
(74) *Attorney, Agent, or Firm* — Keating & Bennett, LLP

(57) ABSTRACT

A surface acoustic wave device includes a piezoelectric substrate including an R-plane, a-plane, or m-plane sapphire substrate and a $LiNbO_3$ film of (90°, 90°, −15° to 15°) or (0°, 90°, −15° to 15°) in terms of Euler angles ($\phi$, $\theta$, $\Psi$) disposed on the sapphire substrate, and electrodes disposed on the piezoelectric substrate and made of metal.

17 Claims, 17 Drawing Sheets

SURFACE ACOUSTIC WAVE DEVICE

BACKGROUND OF THE INVENTION

1. Field of the Invention

The present invention relates to a surface acoustic wave device for use in a resonator, a band-pass filter, and other electronic components, and more specifically relates to a surface acoustic wave device including a piezoelectric substrate in which an epitaxial $LiNbO_3$ film is laminated on a sapphire substrate.

2. Description of the Related Art

In recent years, an increase in frequency has been required also in surface acoustic wave devices with an increase in frequency in communication apparatuses and the like. Moreover, in a surface acoustic wave filter and the like, an increase in band width has also been strongly required.

In order to achieve an increase in frequency and an increase in band width, it has been required that the acoustic velocity and the electromechanical coupling coefficient $k^2$ of surface acoustic waves are high.

In order to satisfy the above-described requirements, Japanese Unexamined Patent Application Publication No. 10-322158 discloses a surface acoustic wave device 1001 illustrated in FIG. 32.

The surface acoustic wave device 1001 includes a piezoelectric substrate 1004 in which a $LiNbO_3$ film 1003 is laminated on a sapphire substrate 1002. On the piezoelectric substrate 1004, input electrodes 1005 and output electrodes 1006 are provided. The projecting direction of the c axis on the sapphire substrate 1002 and the c axis direction of the $LiNbO_3$ film 1003 are parallel to each other. Therefore, it is disclosed that the acoustic velocity and the electromechanical coupling coefficient $k^2$ of surface acoustic waves can be increased by controlling the propagation direction of the surface acoustic waves.

In contrast, International Publication No. WO98/56109 discloses a surface acoustic wave device employing a piezoelectric substrate in which a $LiNbO_3$ film is laminated on a sapphire substrate or a piezoelectric substrate in which a $LiNbO_3$ film is laminated on a sapphire substrate.

According to the surface acoustic wave device disclosed in Japanese Unexamined Patent Application Publication No. 10-322158 or International Publication No. WO98/56109, an increase in the velocity or an electromechanical coupling coefficient of surface acoustic waves has been achieved by the use of the piezoelectric substrate in which the $LiNbO_3$ film or the $LiNbO_3$ film is laminated on the sapphire substrate, i.e., R-plane sapphire substrate. However, in recent years, a further increase in frequency or a further increase in band width has been required, and thus an increase in the acoustic velocity and the electromechanical coupling coefficient $k^2$ of surface acoustic waves has more strongly demanded.

Moreover, in order to achieve a reduction in the size of surface acoustic wave devices, an increase in a reflection coefficient has also been strongly demanded.

SUMMARY OF THE INVENTION

Preferred embodiments of the present invention provide a surface acoustic wave device in which the acoustic velocity and the electromechanical coupling coefficient $k^2$ of surface acoustic waves can be further increased and moreover a reflection coefficient can be increased as compared with conventional surface acoustic wave devices in view of the present circumstances of the former techniques described above.

The present inventors have conducted continuous research in order to determine how to achieve an increase in the velocity of surface acoustic waves in a surface acoustic wave device. As a result, the present inventors have discovered that when a sapphire substrate of a specific crystal orientation and a $LiNbO_3$ film of a specific crystal orientation are combined in a configuration including a piezoelectric substrate in which a $LiNbO_3$ film is laminated on an R-plane, a-plane, or m-plane sapphire substrate, the acoustic velocity of surface acoustic waves is effectively increased. Based on this discovery, preferred embodiments of the present invention were developed.

More specifically, a person skilled in the art could not and would not have imagined increasing the acoustic velocity of surface acoustic waves by the use of the above-described specific sapphire substrate and the above-described specific $LiNbO_3$ film when at the present application was filed, and the acoustic velocity of surface acoustic waves cannot be effectively increased without using the specific combination of features of preferred embodiments of the present invention.

According to a wide aspect of a preferred embodiment of the present invention, a surface acoustic wave device includes a piezoelectric substrate including an R-plane, a-plane, or m-plane sapphire substrate and a $LiNbO_3$ film of (90°, 90°, −15° to 15°) in terms of Euler angles ($\phi$, $\theta$, $\Psi$) disposed on the sapphire substrate; and electrodes disposed on the piezoelectric substrate and made of metal.

In a specific aspect of the surface acoustic wave device according to a preferred embodiment of the present invention, a primary order mode of a surface acoustic wave is utilized, and when the wavelength of the surface acoustic wave is defined as $\lambda$, the $LiNbO_3$ film thickness is preferably in the range of about $0.1\lambda$ to about $1.6\lambda$ and preferably in the range of about $0.15\lambda$ to about $0.9\lambda$ when the Euler angle $\Psi$ is about −5° or more and about +5° or lower, i.e., preferably in the range of 0°±about 5° and is preferably in the range of about $0.18\lambda$ to about $0.75\lambda$ when $\Psi$ is about −15° or more and lower than about −5° or larger than about +5° and about +15° or lower. Thus, the acoustic velocity of the surface acoustic waves can be further increased and the electromechanical coupling coefficient $k^2$ can be further increased.

In another specific aspect of the surface acoustic wave device according to a preferred embodiment of the present invention, a secondary order mode of a surface acoustic wave is utilized, and when the wavelength of the surface acoustic wave is defined as $\lambda$, the $LiNbO_3$ film thickness is preferably in the range of about $0.4\lambda$ to about $1.6\lambda$ and preferably in the range of about $0.6\lambda$ to about $1.6\lambda$ when the Euler angle $\Psi$ is about −5° to about 5°.

In another specific aspect of the surface acoustic wave device according to a preferred embodiment of the present invention, a tertiary order mode of a surface acoustic wave is utilized, and when the wavelength of the surface acoustic wave is defined as $\lambda$, the $LiNbO_3$ film thickness is preferably in the range of about $0.6\lambda$ to about $1.6\lambda$ when the Euler angle $\Psi$ is about −5° to about 5°. In this case, by utilizing the tertiary order mode, a further increase in frequency can be achieved and a further increase in the acoustic velocity and the electromechanical coupling coefficient $k^2$ of the surface acoustic waves can be achieved.

In another specific aspect of the surface acoustic wave device according to a preferred embodiment of the present invention, the electrodes are made of Al, and when the wavelength of the surface acoustic waves is defined as $\lambda$, the thickness of the electrodes made of Al is preferably in the range of about $0.02\lambda$ to about $0.16\lambda$, for example. In this case, the electromechanical coupling coefficient k2 can be further increased and the reflection coefficient can be increased.

In another specific aspect of the surface acoustic wave device according to a preferred embodiment of the present invention, the metallization ratio of the electrodes is preferably in the range of about 0.2 to about 0.7. Thus, the reflection coefficient can be further increased and the electromechanical coupling coefficient $k^2$ can be increased.

In another wide aspect of a preferred embodiment of the present invention, a surface acoustic wave device includes a piezoelectric substrate including an R-plane, a-plane, or m-plane sapphire substrate and a $LiNbO_3$ film of (0°, 90°, −15° to 15°) in terms of Euler angles ($\phi$, $\theta$, $\Psi$) disposed on the sapphire substrate and; and electrodes disposed on the piezoelectric substrate and made of metal.

In a specific aspect of the surface acoustic wave device according to a preferred embodiment of the present invention, a primary order mode of a surface acoustic wave is utilized, and when the wavelength of surface acoustic wave is defined as $\lambda$, the $LiNbO_3$ film thickness is preferably in the range of about 0.1$\lambda$ to about 1.6$\lambda$ and preferably in the range of about 0.12$\lambda$ to about 1.2$\lambda$ when the Euler angle $\Psi$ is about −5° or more and about +5° or lower and is preferably in the range of about 0.17$\lambda$ to about 0.8$\lambda$ when $\Psi$ is about −15° or more and lower than about −5° or larger than about +5° and about +15° or lower. In this case, the acoustic velocity and the electromechanical coupling coefficient $k^2$ of the surface acoustic waves can be further increased.

In another specific aspect of the surface acoustic wave device according to a preferred embodiment of the present invention, a secondary order mode of a surface acoustic wave is utilized, and when the wavelength of the surface acoustic wave is defined as $\lambda$, the $LiNbO_3$ film thickness is preferably in the range of about 0.4$\lambda$ to about 1.6$\lambda$ when the Euler angle $\Psi$ is about −5° to about 5°.

In another specific aspect of the surface acoustic wave device according to a preferred embodiment of the present invention, a tertiary order mode of a surface acoustic wave is utilized, and when the wavelength of the surface acoustic wave is defined as $\lambda$, the $LiNbO_3$ film thickness is preferably in the range of about 0.6$\lambda$ to about 1.0$\lambda$ when the Euler angle $\Psi$ is about −5° to about 5°.

In another specific aspect of the surface acoustic wave device according to a preferred embodiment of the present invention, the electrodes are made of Al, and when the wavelength of the surface acoustic waves is defined as $\lambda$, the thickness of the electrodes made of Al is preferably in the range of about 0.02$\lambda$ to about 0.16$\lambda$ and preferably in the range of about 0.04$\lambda$ to about 0.14$\lambda$. In this case, the reflection coefficient can be increased and the electromechanical coupling coefficient $k^2$ can be further increased.

In another specific aspect of the surface acoustic wave device according to a preferred embodiment of the present invention, the metallization ratio of the electrodes is preferably in the range of about 0.2 to about 0.7. In this case, the reflection coefficient can be increased and the electromechanical coupling coefficient $k^2$ can be further increased.

In another specific aspect of the surface acoustic wave device according to a preferred embodiment of the present invention, a primary order mode of a surface acoustic wave is utilized, and the piezoelectric substrate further has a short circuit electrode between the R-plane, a-plane, or m-plane sapphire substrate and the $LiNbO_3$ film. Thus, the acoustic velocity can be further increased.

In another specific aspect of the surface acoustic wave device according to a preferred embodiment of the present invention, when the wavelength of the surface acoustic wave is defined as $\lambda$, the $LiNbO_3$ film thickness is preferably in the range of about 0.15$\lambda$ to about 1.6$\lambda$ and preferably in the range of about 0.2$\lambda$ to about 0.75$\lambda$. Thus, the acoustic velocity can be further increased.

In another specific aspect of the surface acoustic wave device according to a preferred embodiment of the present invention, a secondary order mode of surface acoustic wave is utilized, and the piezoelectric substrate further has a short circuit electrode between the R-plane, a-plane, or m-plane sapphire substrate and the $LiNbO_3$ film. Thus, the acoustic velocity can be further increased.

In another specific aspect of the surface acoustic wave device according to a preferred embodiment of the present invention, when the wavelength of the surface acoustic wave is defined as $\lambda$, the $LiNbO_3$ film thickness is preferably in the range of about 0.4$\lambda$ to about 1.6$\lambda$ and preferably in the range of about 0.6$\lambda$ to about 1.6$\lambda$. Thus, the acoustic velocity can be further increased.

According to the surface acoustic wave device provided in the first wide aspect of a preferred embodiment of the present invention, since the piezoelectric substrate in which the $LiNbO_3$ with Euler angles (90°, 90°, −15° to 15°) is disposed on the R-plane, a-plane, or m-plane sapphire substrate is included, the acoustic velocity of the used surface acoustic waves can be increased and the electromechanical coupling coefficient $k^2$ can be sufficiently increased. Therefore, an increase in frequency and an increase in band width of the surface acoustic wave device can be achieved.

According to the surface acoustic wave device provided in the second wide aspect of a preferred embodiment of the present invention, since the piezoelectric substrate in which the $LiNbO_3$ with Euler angles (0°, 90°, −15° to 15°) is disposed on the R-plane, a-plane, or m-plane sapphire substrate is included, the acoustic velocity of the used surface acoustic waves can be increased and the electromechanical coupling coefficient $k^2$ can be sufficiently increased. Therefore, an increase in frequency and an increase in band width of the surface acoustic wave device can be achieved.

In the following description, $LiNbO_3$ is abbreviated as LN depending on cases.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the details of preferred embodiments of the present invention are described.

Figure 1:
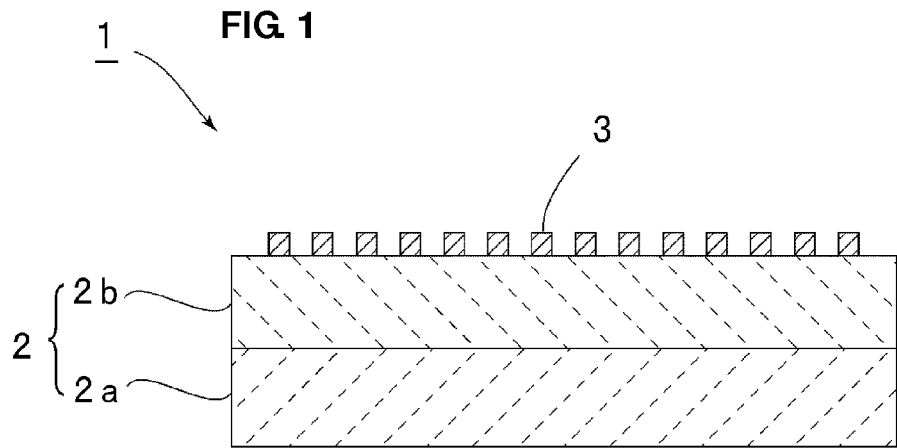
FIG. 1 is a front cross sectional view of a surface acoustic wave device according to a preferred embodiment of the present invention.

FIG. 1 is a front cross sectional view of a surface acoustic wave device according to a preferred embodiment of the present invention. A surface acoustic wave device 1 includes a piezoelectric substrate 2. The piezoelectric substrate 2 includes an R-plane, a-plane, or m-plane sapphire substrate 2a and a LiNbO$_3$ film 2b laminated on the R-plane, a-plane, or m-plane sapphire substrate 2a. When the LiNbO$_3$ film 2b is represented by the Euler angles (φ, θ, Ψ), the LiNbO$_3$ film 2b is a LiNbO$_3$ film (90°, 90°, −15° to 15°), or (0°, 90°, −15° to 15°).

On the LiNbO$_3$ film 2b, electrodes 3 made of metal are disposed. The electrodes 3 include at least one interdigital electrode to excite surface acoustic waves. The structure of the electrodes 3 is not particularly limited and an appropriate electrode structure in accordance with the function of surface acoustic wave devices, such as a surface acoustic wave resonator or a surface acoustic wave filter.

Moreover, an appropriate metal can be used for the material of the electrodes 3, and Al is preferably used. As described later, by adjusting the thickness or the metallization ratio of electrodes made of Al in a specific range, an increase in the acoustic velocity and/or an increase in the reflection coefficient of surface waves can be achieved.

Hereinafter, the configuration and the effects of the above-described surface acoustic wave device 1 are clarified based on specific non-limiting experimental examples.

In the following description, the crystal orientations of the sapphire substrate and the LiNbO$_3$ are expressed by the Euler angles. Preferably, the R-plane sapphire is (0°, 122°23', Ψ) sapphire in terms of the Euler angles, the m-plane sapphire is (90°, 90°, Ψ) in terms of the Euler angles, and the a-plane sapphire is (0°, 90°, Ψ) in terms of the Euler angles.

In order to express the crystal orientation of the sapphire substrate or the LiNbO$_3$, the Miller index is usually used in addition to the Euler angles. The relationship between the Euler angles and the Miller index is as follows.

R-plane sapphire: Euler angles (0°, 122°23', 0°)=Miller index (012) is established, and is sometimes expressed as (01-12) by the Miller index.

Moreover, there are relationships of Euler angles (90°, 90°, 0°)=Miller index (100) and Euler angles (0°, 90°, 0°)=Miller index (010).

Figure 33:
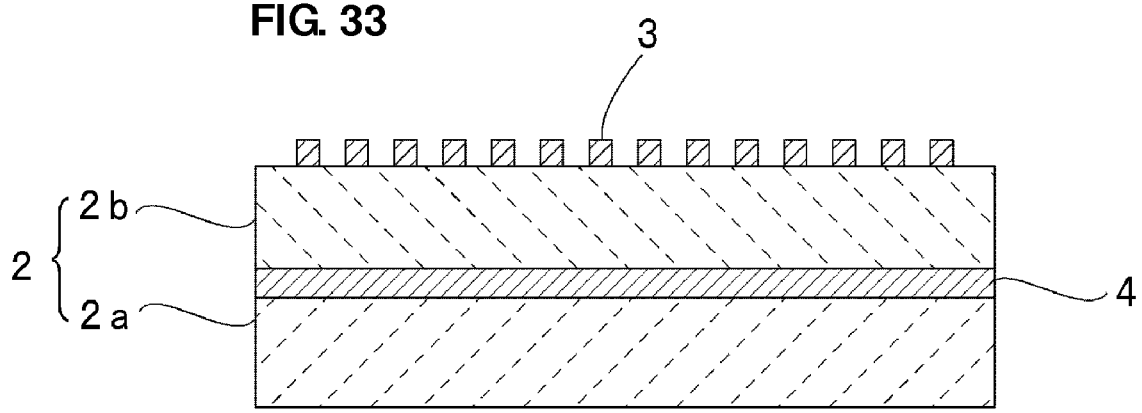
FIG. 33 is a front cross sectional view of interdigital electrodes/LN film/short circuit electrode/sapphire structure.

FIG. 33 is a front cross sectional view illustrating the structure of a modification in which a short circuit electrode 4 is inserted between the sapphire substrate 2a and the LiNbO$_3$ film 2b of the structure of FIG. 1. Herein, the electrode material is Al but metals other than Al may be acceptable insofar as the materials can cause an electrical short circuit.

Figure 2:
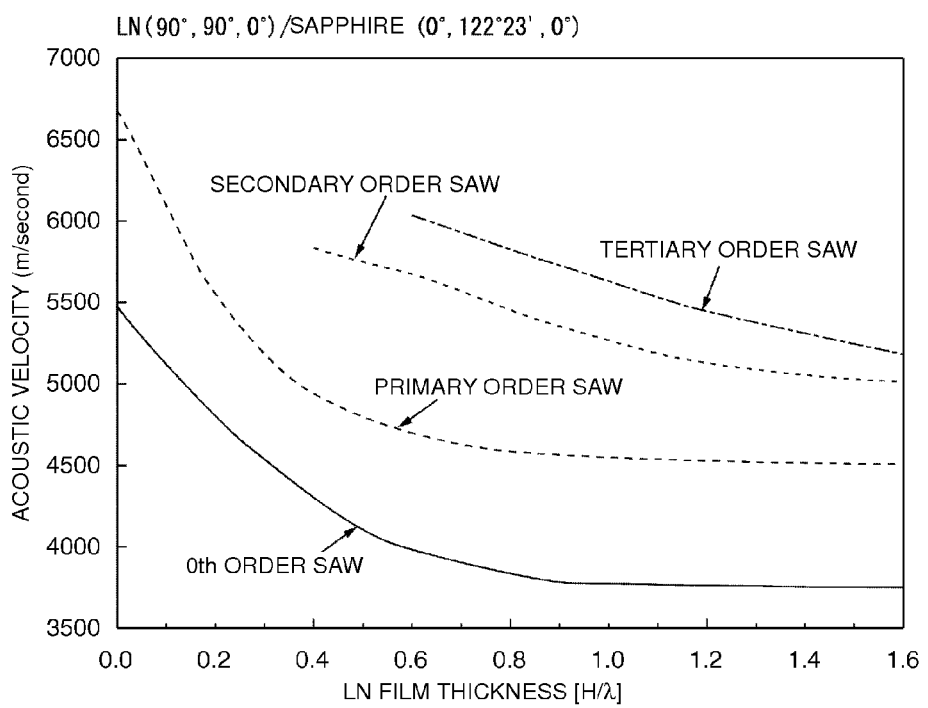
FIG. 2 is a view illustrating the relationship between the thickness of a LN film in a piezoelectric substrate containing (90°, 90°, 0°) LN film/(0°, 122°23', 0°) R-plane sapphire and the acoustic velocity of surface acoustic waves.
Figure 3:
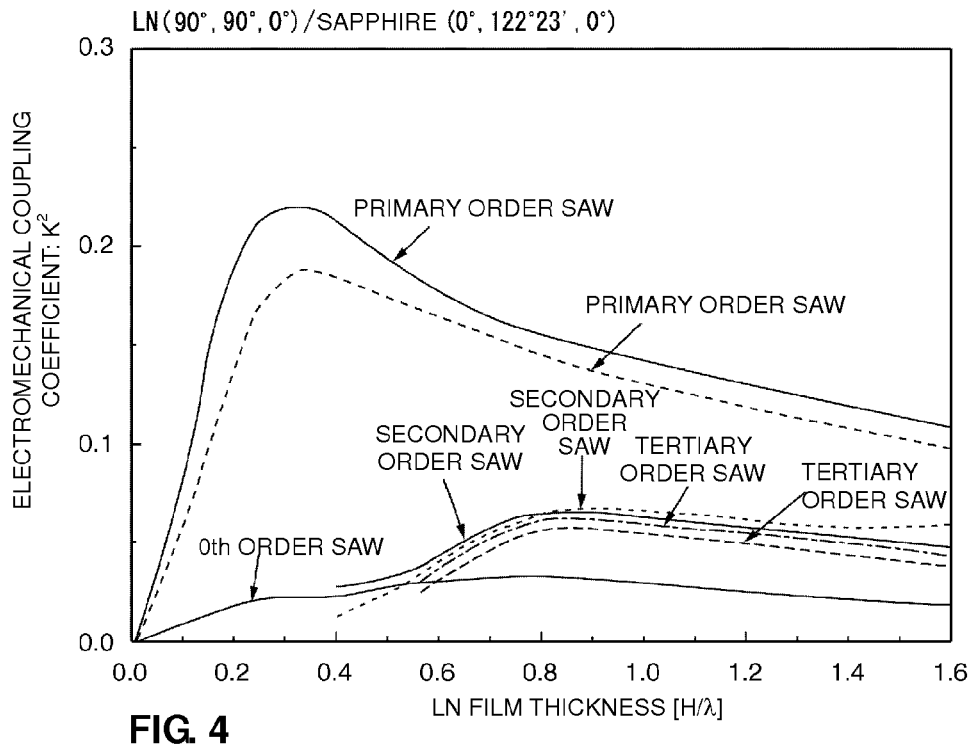
FIG. 3 is a view illustrating the relationship between the thickness of a LN film in a piezoelectric substrate containing (90°, 90°, 0°) LN film/(0°, 122°23', 0°) R-plane sapphire and a piezoelectric substrate containing (90°, 90°, 0°) LN film/ Short circuit electrode/(0°, 122°23', 0°) R-plane sapphire (both structures of FIG. 1 and FIG. 33) and the electromechanical coupling coefficient $k^2$.

FIG. 2 and FIG. 3 are views illustrating the relationship between the thickness of a LiNbO$_3$ film when a piezoelectric substrate in which a LiNbO$_3$ film with Euler angles (90°, 90°, 0°) is laminated on an R-plane sapphire substrate with Euler angles (0°, 122°23', 0°) is included and the acoustic velocity of surface acoustic waves and between the thickness and the electromechanical coupling coefficient $k^2$ of both structures of FIG. 1 and FIG. 33, respectively. A difference in the electromechanical coupling coefficient $k^2$ in the structures of FIG. 1 and FIG. 33 is not so large.

In the following description, LiNbO$_3$ is abbreviated as a LN film as appropriate.

In the structure in which the electrodes are disposed on the piezoelectric substrate, a 0th order surface acoustic wave and primary order, secondary order, and tertiary order surface acoustic waves which are higher order mode surface acoustic waves are excited as illustrated in FIG. 2. As is clear from FIG. 3, when a primary order surface acoustic wave and a secondary order surface acoustic wave are used, a high electromechanical coupling coefficient can be obtained as compared with the case where a 0th order surface acoustic wave is used.

Normally, in the surface acoustic wave device including the LiNbO$_3$ substrate, the acoustic velocity is about 4,000 m/second, for example. In contrast, FIG. 2 shows that the acoustic velocity of the primary order surface acoustic wave can be considerably increased to about 4,600 m/second or more when the thickness of the LN film is below about 1.6λ or lower when (90°, 90°, 0°) LN film/(0°, 122°23', 0°) R-plane sapphire is used. Similarly, also about the secondary order surface acoustic wave, it was discovered that the acoustic velocity is as high as 5,100 m/second or more when the film thickness of the LN film is about 1.6λ or lower, more specifically, preferably in the range of about 0.4λ to about 1.6λ. Furthermore, about the tertiary order surface acoustic wave, the acoustic velocity of the surface acoustic wave is considerably increased to 5,300 m/second or more when the film thickness of the LN film is in the range of about 0.6λ to about 1.6λ.

Moreover, FIG. 3 shows that when a primary order surface acoustic wave, a secondary order surface acoustic wave, and a tertiary order surface acoustic wave are used, the electromechanical coupling coefficient $k^2$ can be increased as compared with a 0th order surface acoustic wave is used in such a range where the acoustic velocity is high.

Particularly in the case of the primary order surface acoustic wave, it was discovered that the electromechanical coupling coefficient can be increased as compared with the case of the 0th order surface acoustic wave over the range of the film thickness of the LN film of 0 to about 1.6λ. Preferably, as is understood from FIG. 3, by adjusting the film thickness of the LN film in the range of 0.1λ to about 1.6λ, the electromechanical coupling coefficient $k^2$ can be increased to about 0.1 or more. More preferably, by adjusting the film thickness of the LN film in the range of about 0.15λ to about 0.9λ, the electromechanical coupling coefficient $k^2$ of about 0.15 or more can be achieved.

When the secondary order surface acoustic wave is used, the electromechanical coupling coefficient $k^2$ of about 0.025 or more can be achieved over the range of the film thickness of the LN film of about 0.4λ to about 1.6λ. More preferably, it was discovered that, by adjusting the thickness in the range of about 0.6λ to about 1.6λ, the electromechanical coupling coefficient $k^2$ of about 0.03 or more can be achieved.

It was also discovered that when the tertiary order surface acoustic wave is used, the electromechanical coupling coefficient $k^2$ of about 0.03 or more can be achieved by adjusting the film thickness of the LN film to about 0.1λ to about 1.6λ.

FIG. 3 shows the electromechanical coupling coefficient $k^2$ of both the structures of the structure of FIG. 1 which is one preferred embodiment of the present invention and FIG. 33 which is a modification thereof. The structure of FIG. 33 which is a modification is different from the structure of FIG. 1 which is a preferred embodiment in that a short circuit electrode is provided between the sapphire substrate and the LN film.

In FIG. 3, those represented as the primary order SAW, the secondary order SAW, and the tertiary order SAW represent the electromechanical coupling coefficients $k^2$ of the structure of FIG. 1. Those represented as the primary order SAW vfm-vmm, the secondary order SAW vfm-vmm, and tertiary order SAW vfm-vmm represent the electromechanical coupling coefficients $k^2$ of the structure of FIG. 33.

As is clear from FIG. 3, it was discovered that, also in the primary order, the secondary order, and the tertiary order surface acoustic waves of the structure of the modification, the electromechanical coupling coefficient $k^2$ which is almost the same as that of the present preferred embodiment is obtained by adjusting the film thickness of the LN film to be almost the same as the film thickness of the present preferred embodiment.

Figure 4:
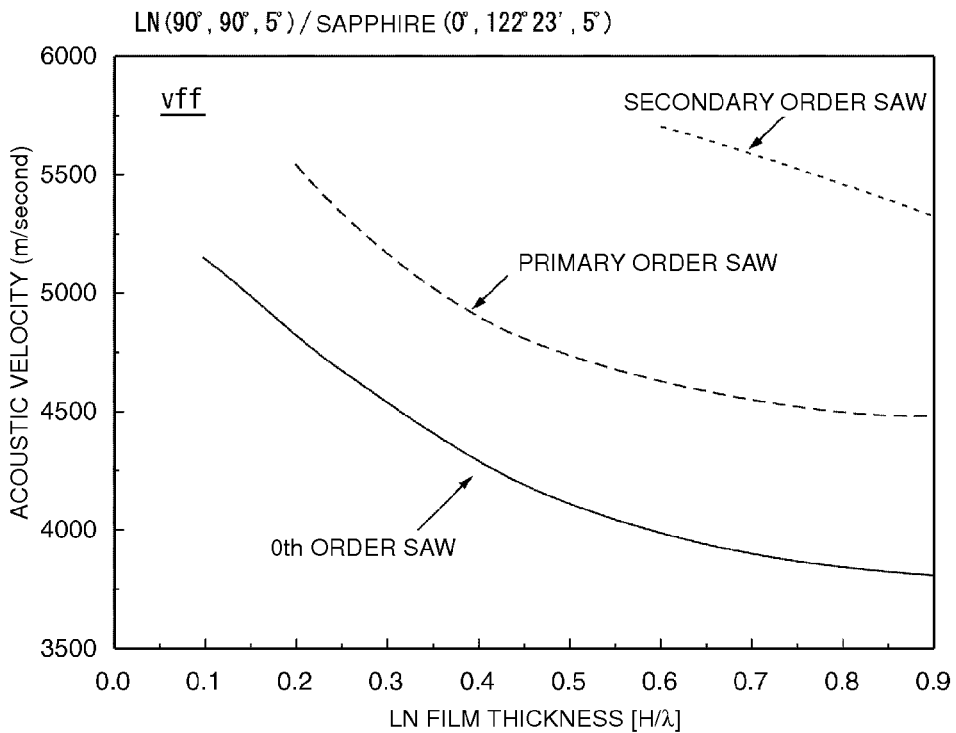
FIG. 4 is a view illustrating the relationship between the thickness of a LN film in a piezoelectric substrate containing (90°, 90°, 5°) LN film/(0°, 122°23', 5°) R-plane sapphire and the acoustic velocity of surface acoustic waves.
Figure 5:
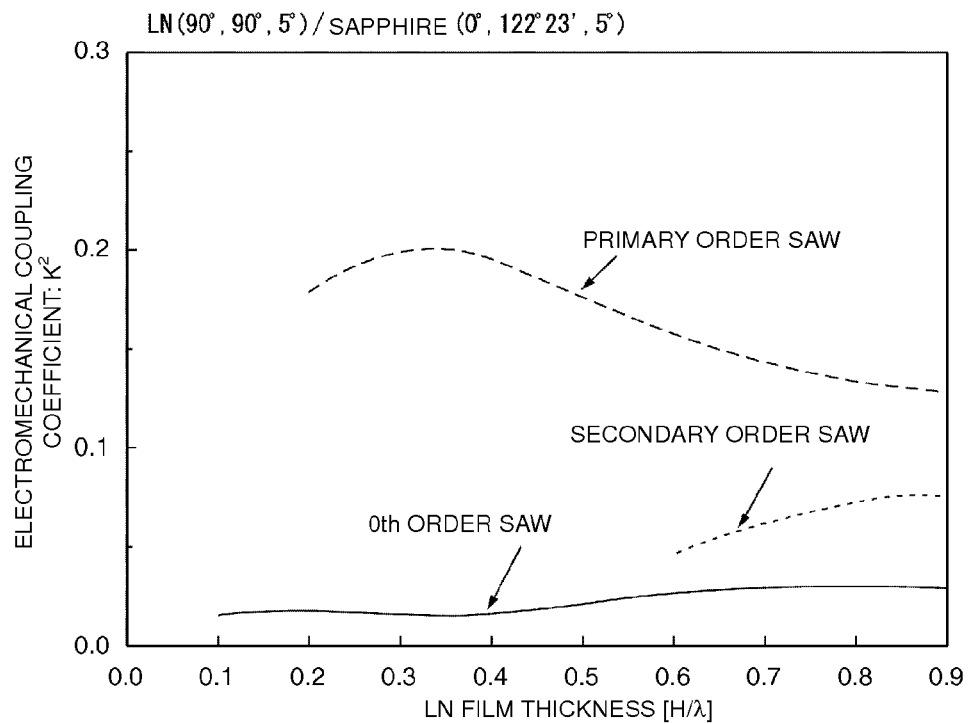
FIG. 5 is a view illustrating the relationship between the thickness of a LN film in a piezoelectric substrate containing LN (90°, 90°, 5°) film/(0°, 122°23', 5°) R-plane sapphire (structure of FIG. 1) and the electromechanical coupling coefficient $k^2$.

In FIG. 2 and FIG. 3, the Euler angles of the LN film were (90°, 90°, 0°) and the Euler angles of the R-plane sapphire were (0°, 122°23', 0°). The changes in the Euler angles when the propagation direction Ψ was changed were confirmed. FIG. 4 and FIG. 5 are views illustrating the relationship between the thickness of the LN film when the Euler angles of the LN film are (90°, 90°, 5°) and the Euler angles of the R-plane sapphire are (0°, 122°23', 5°) and the acoustic velocity and between the thickness and the electromechanical coupling coefficient $k^2$ of surface acoustic waves, respectively.

The vff in FIG. 4 refers to the acoustic velocity of surface acoustic waves in the open state in the piezoelectric substrate of the structure of FIG. 1. Similarly, the vff in FIG. 6 and FIG. 7 described below refer to the acoustic velocity in the open state in the piezoelectric substrate of the structure of FIG. 1 and the vfm refers to the acoustic velocity in the short circuit state.

Moreover, the vfm in FIG. 3 refers to the acoustic velocity of surface acoustic waves in the open state in the piezoelectric substrate of the structure of FIG. 33. The vmm refers to the acoustic velocity in the short circuit state in the piezoelectric substrate of the structure of FIG. 33.

Figure 6:
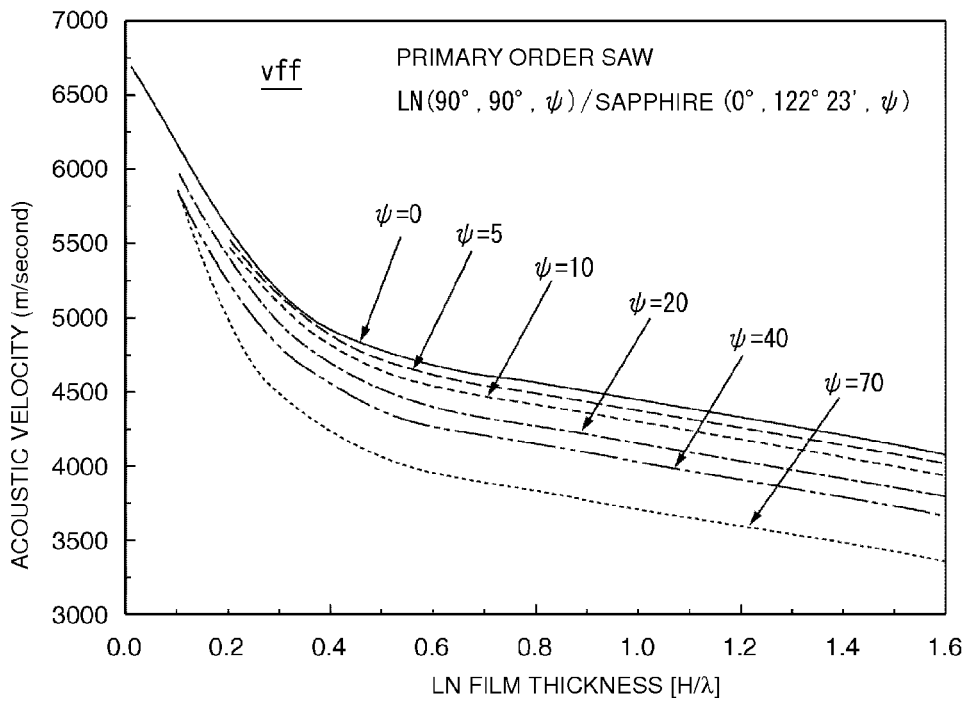
FIG. 6 is a view illustrating the relationship between the thickness of a LN film in a piezoelectric substrate containing (90°, 90°, LN film/(0°, 122°23', Ψ) R-plane sapphire, the propagation direction Ψ, and the acoustic velocity of primary order surface acoustic waves.
Figure 7:
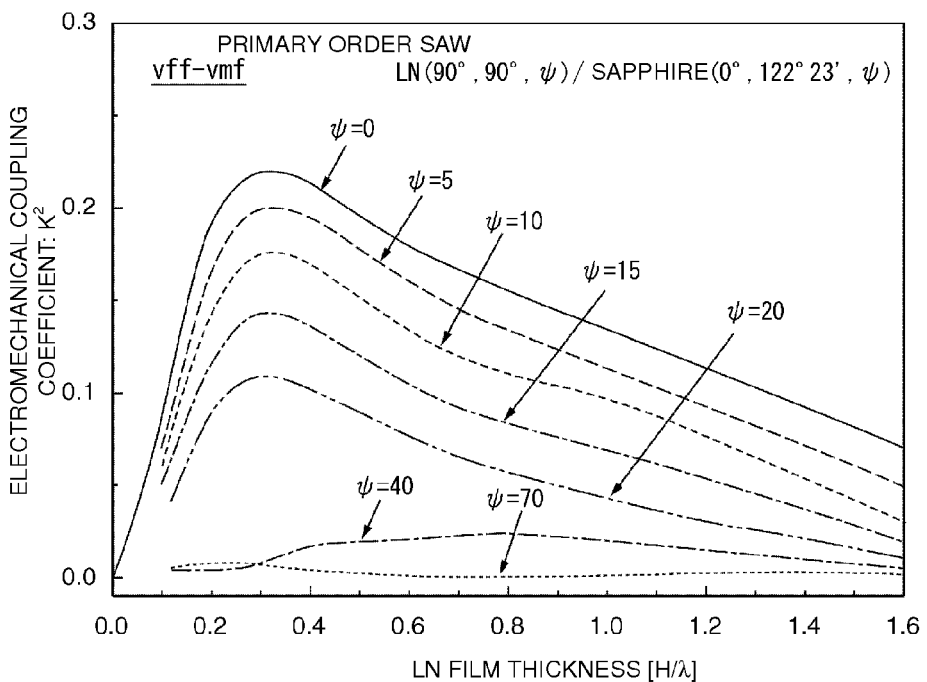
FIG. 7 is a view illustrating the relationship between the thickness of a LN film in a piezoelectric substrate containing (90°, 90°Ψ), LN film/(0°, 122°23', Ψ) R-plane sapphire, the propagation direction Ψ, and the electromechanical coupling coefficient $k^2$ of primary order surface acoustic waves.

As is clear from FIG. 4 and FIG. 5, it was discovered that, also when the propagation direction Ψ of the Euler angles of the LN film and the R-plane sapphire is changed to about 5° from 0°, there is the same tendency as those of FIG. 2 and FIG. 3. Similarly as in FIG. 4 and FIG. 5, the relationship between the thickness of the LN film and the acoustic velocity of surface acoustic waves and the relationship between the thickness and the electromechanical coupling coefficient $k^2$ of surface acoustic waves were determined by changing the propagation direction Ψ of the LN film and the propagation direction Ψ of the R-plane sapphire to 0°, 5°, 10°, 20°, 40°, or 70°. The results are shown in FIG. 6 and FIG. 7. As illustrated in FIG. 7, Ψ=15° is at the midpoint between 10° and 20°.

As is clear from FIG. 6, the acoustic velocity of the surface acoustic waves decreases as the thickness of the LN film increases in all of the cases where the propagation direction Ψ is 0°, 5°, 10°, 20°, 40°, or 70°. However, it was discovered that when the thickness of the LN film is in the range about 0.8λ or lower, the acoustic velocity of the surface acoustic waves can be increased to about 4000 m/second in all of the cases.

In particular, it was discovered that when the thickness of the LN film is in the range of about 0.8λ or lower, the acoustic velocity of the surface acoustic waves can be increased to about 4300 m/second or more when Ψ is lower than about 20°, and preferably, by adjusting Ψ to be about 10° or lower, the acoustic velocity of the surface acoustic waves can be increased to about 4400 m/second or more.

As is clear from FIG. 7, it was discovered that, by adjusting the propagation direction Ψ to be lower than about 20°, a high electromechanical coupling coefficient $k^2$ is obtained. Preferably, the propagation direction Ψ is desirably about 15° or lower. Thus, the electromechanical coupling coefficient $k^2$ can be increased. More preferably, FIG. 7 shows that, by adjusting the propagation direction Ψ to about 5° or lower, a high electromechanical coupling coefficient $k^2$ can be obtained.

Therefore, as is clear from FIG. 4 to FIG. 7, it was discovered that, in the lamination structure of the LiNbO₃ with Euler angles (90°, 90°, Ψ) and the sapphire with Euler angles (0°, 122°23', Ψ), when the propagation direction Ψ is lower than about 20°, preferably in the range of about 15° or lower, and more preferably in the range of about 5° or lower, the acoustic velocity of the surface acoustic waves can be increased and the electromechanical coupling coefficient $k^2$ can be effectively increased.

More specifically, the electromechanical coupling coefficient $k^2$ can be effectively increased by adjusting the film thickness of the LN film in the range of about 0.1λ to about 1.6λ when the Euler angle Ψ is about −5° or more and about +5° or lower and by adjusting the film thickness in the range of about 0.18λ to about 0.75λ when Ψ is about −15° or more and lower than about −5° or larger than about +5° and about +15° or lower.

Even when the propagation direction Ψ is a negative value, the same results when the direction Ψ is a positive value are obtained. Therefore, it was discovered that the Euler angles of the R-plane sapphire may preferably be in the range of (0°, 122°23', 0°±15°), in other words in the range of (0°, 122°23', −15° to 15°), and preferably in the range of (0°, 122°23', −5° to 5°).

[LN Film with Euler Angles (0°, 90°, 0°)/R-Plane Sapphire with Euler Angles (0°, 122°23', 0°)]

Figure 8:
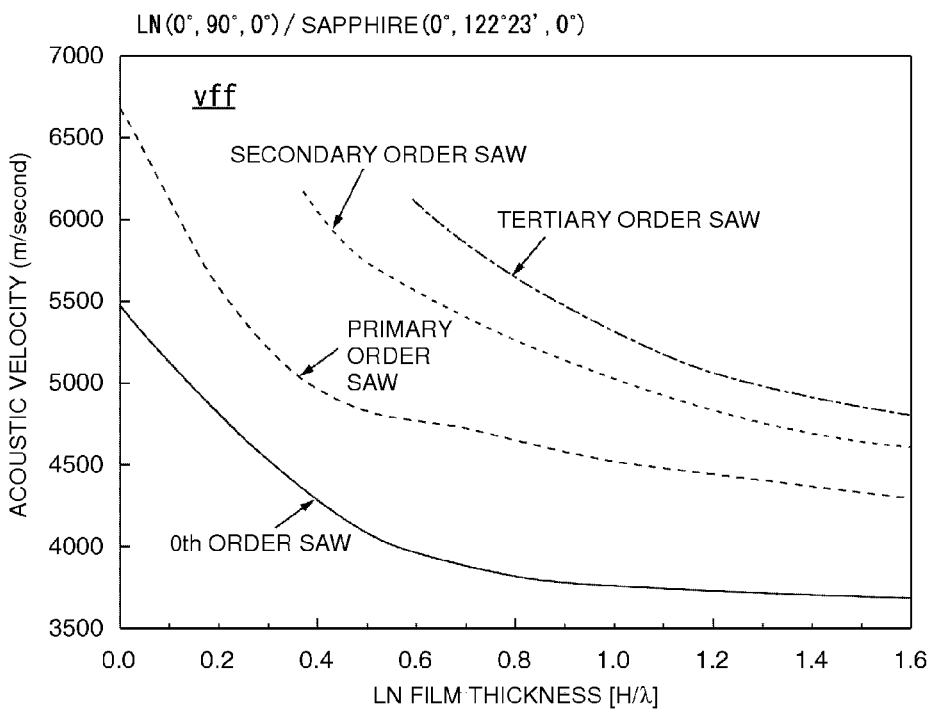
FIG. 8 is a view illustrating the relationship between the thickness of a LN film in a piezoelectric substrate containing (0°, 90°, 0°) LN film/(0°, 122°23', 0°) R-plane sapphire and the acoustic velocity of surface acoustic waves.
Figure 9:
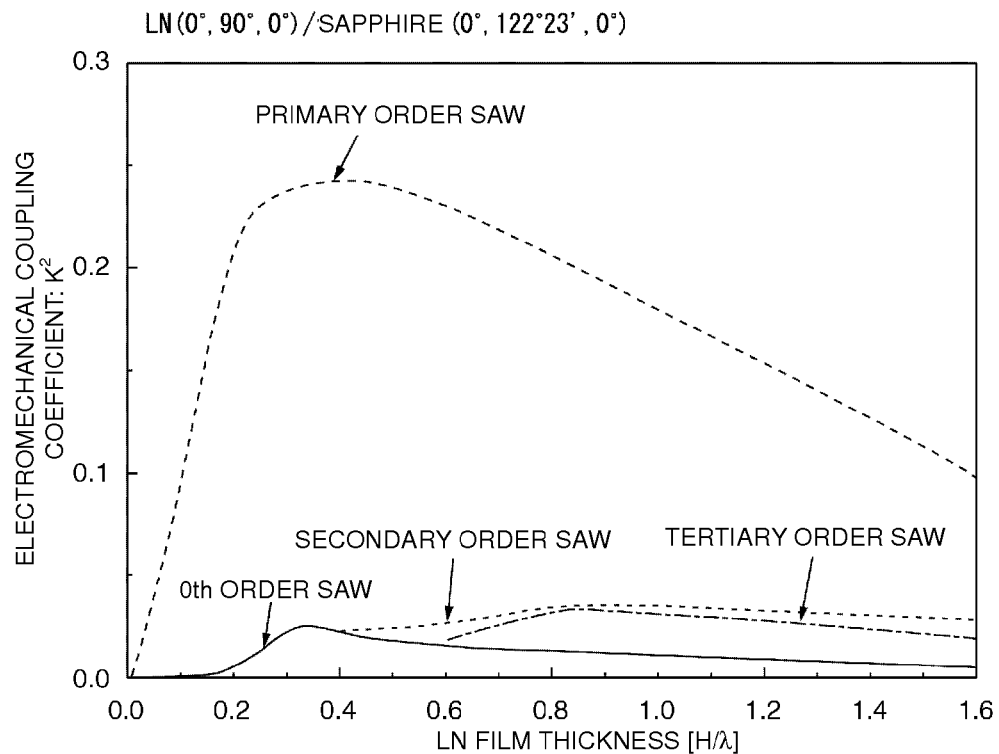
FIG. 9 is a view illustrating the relationship between the thickness of a LN film in a piezoelectric substrate containing LN (0°, 90°, 0°) film/(0°, 122°23', 0°) R-plane sapphire and an electromechanical coupling coefficient $k^2$.

FIG. 8 and FIG. 9 are views illustrating the relationship between the thickness of a LiNbO₃ film in the case of the structure of FIG. 1 including a piezoelectric substrate in which a LiNbO₃ film with Euler angles (0°, 90°, 0°) is disposed on an R-plane sapphire substrate with Euler angles (0°, 122°23', 0°) and the acoustic velocity of surface acoustic waves and between the thickness and the electromechanical coupling coefficient $k^2$, respectively.

In the structure in which electrodes are disposed on the piezoelectric substrate, a 0th order surface acoustic wave, a primary order surface acoustic wave, a secondary order surface acoustic wave, and a tertiary order surface acoustic wave are excited as illustrated in FIG. 8. As is clear from the drawings, when the primary order surface acoustic wave, the secondary order surface acoustic wave, and the tertiary order surface acoustic wave are used, a high electromechanical coupling coefficient can be obtained as compared with the case where the 0th order surface acoustic wave is used.

Normally, in the surface acoustic wave device including the LiNbO₃ substrate, the acoustic velocity is about 4,000 m/second. In contrast, it was discovered that, in the case where (0°, 90°, 0°) LN film/(0°, 122°23', 0°) R-plane sapphire is used, the acoustic velocity of the primary order surface acoustic wave can be considerably increased to about 4,400 m/second or more over the range of the thickness of the LN film of about 1.6λ or lower. Similarly, also about the secondary order surface acoustic wave, it was discovered that when the film thickness of the LN film is in the range of about $1.6\lambda$ or more and more specifically in the range of about $0.4\lambda$ to about $1.6\lambda$, the acoustic velocity is as high as about 5,300 m/second or more. With respect to the tertiary order surface acoustic wave, when the film thickness of the LN film is in the range of about $0.65\lambda$ to about $0.9\lambda$, the acoustic velocity of the surface acoustic wave is considerably increased to about 4,900 m/second or more.

FIG. 9 shows that when the primary order surface acoustic wave, the secondary order surface acoustic wave, and the tertiary order surface acoustic wave are used, the electromechanical coupling coefficient $k^2$ can be increased as compared with the case where the 0th order surface acoustic wave is used in such a range where the acoustic velocity is high. Particularly in the case of the primary order surface acoustic wave, it was discovered that the electromechanical coupling coefficient can be increased over the range of the film thickness of the LN film of 0 to about $1.6\lambda$ as compared with the case of the 0th order surface acoustic wave. As is understood from FIG. 9, preferably, the electromechanical coupling coefficient $k^2$ can be increased to about 0.1 or more by adjusting the film thickness of the LN film in the range of about $0.1\lambda$ to about $1.6\lambda$ and, more preferably, the electromechanical coupling coefficient $k^2$ of about 0.15 or more can be achieved by adjusting the film thickness of the LN film in the range of about $0.14\lambda$ to about $1.2\lambda$.

When the secondary order surface acoustic wave is used, the electromechanical coupling coefficient $k^2$ can be increased to about 0.025 or more by adjusting the film thickness of the LN film in the range of about $0.4\lambda$ to about $1.6\lambda$ and, more preferably, the electromechanical coupling coefficient $k^2$ of about 0.03 or more can be achieved by adjusting the film thickness of the LN film in the range of about $0.6\lambda$ to about $1.6\lambda$.

It was discovered that when the tertiary order surface acoustic wave is used, the electromechanical coupling coefficient $k^2$ of about 0.02 or more can be achieved by adjusting the film thickness of the LN film to about $0.6\lambda$ to about $1.6\lambda$.

Figure 10:
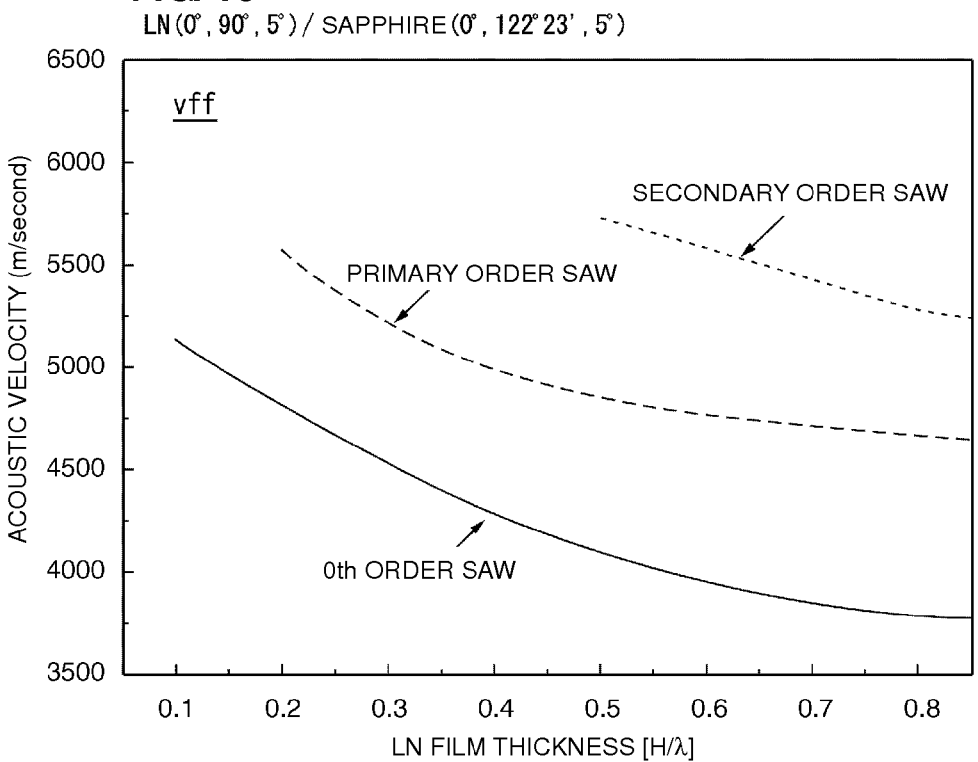
FIG. 10 is a view illustrating the relationship between the thickness of a LN film in a piezoelectric substrate containing (0°, 90°, 5°) LN film/(0°, 122°23', 5°) R-plane sapphire and the acoustic velocity of surface acoustic waves.
Figure 11:
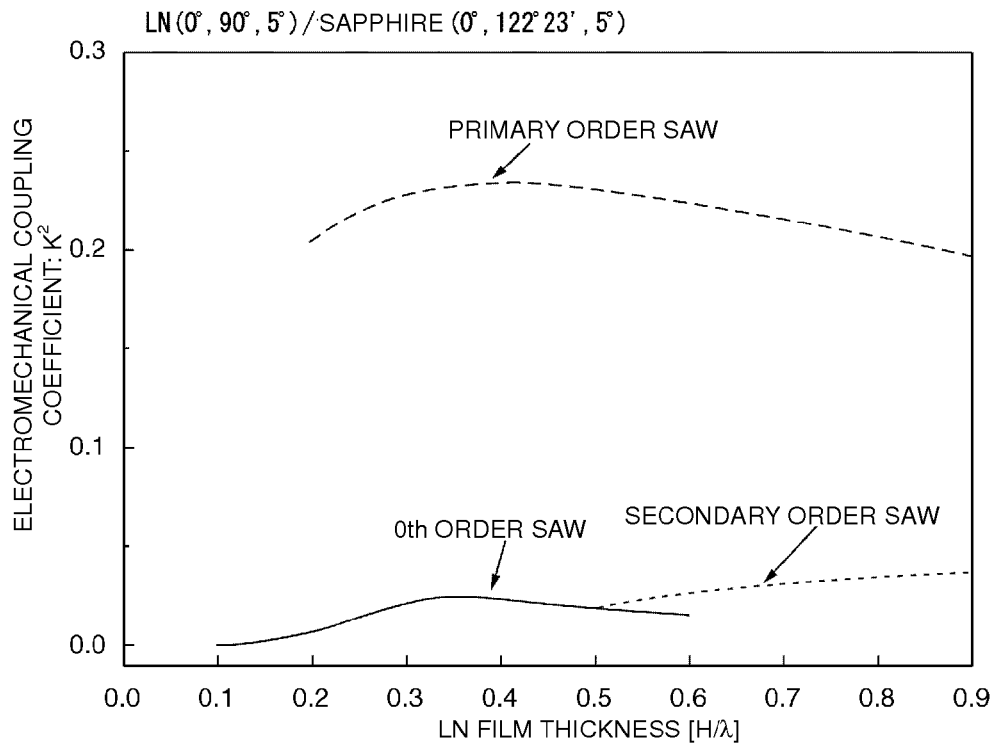
FIG. 11 is a view illustrating the relationship between the thickness of a LN film in a piezoelectric substrate containing (0°, 90°, 5°) LN film/(0°, 122°23', 5°) R-plane sapphire and an electromechanical coupling coefficient $k^2$.

In FIG. 8 and FIG. 9, the Euler angles of the LN film were $(0°, 90°, 0°)$ and the Euler angles of the R-plane sapphire were $(0°, 122°23', 0°)$. Here, it was confirmed how the changes would occur when the propagation direction $\Psi$ was changed. FIG. 10 and FIG. 11 are views illustrating the relationship between the thickness of an LN film when the Euler angles of the LN film are $(0°, 90°, 5°)$ and the Euler angles of the R-plane sapphire are $(0°, 122°23', 5°)$ and the acoustic velocity and between the thickness and the electromechanical coupling coefficient $k^2$ of surface acoustic waves, respectively.

As is clear from FIG. 10 and FIG. 11, it was discovered that also when the propagation directions $\Psi$ of the Euler angles of the LN film and the R-plane sapphire are changed to about 5° from 0°, there is the same tendency as those of FIG. 8 and FIG. 9. Similarly as in FIG. 10 and FIG. 11, the relationship between the thickness of the LN film and the acoustic velocity of surface acoustic waves and the relationship between the thickness and the electromechanical coupling coefficient $k^2$ of surface acoustic waves were determined by changing the propagation direction $\Psi$ of the LN film and the propagation direction $\Psi$ of the R-plane sapphire to 0°, 5°, 10°, 20°, 40°, or 70°. The results are shown in FIG. 12 and FIG. 13.

Figure 12:
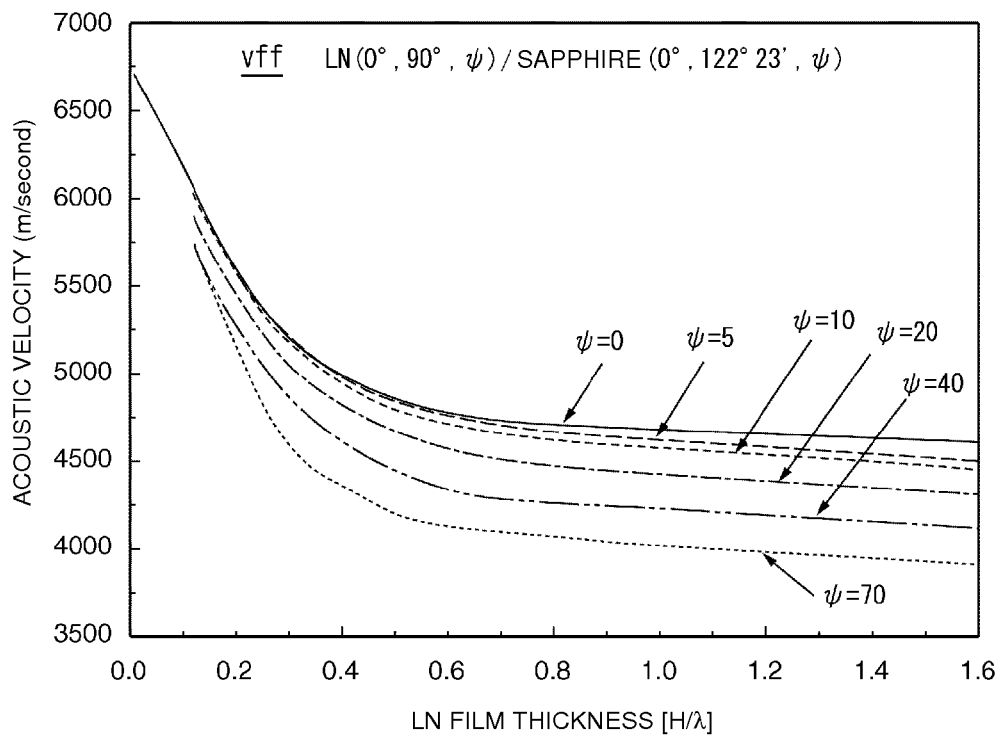
FIG. 12 is a view illustrating the relationship between the thickness of a LN film in a piezoelectric substrate containing (0°, 90°, LN film/(0°, 122°23', R-plane sapphire, the propagation direction Ψ, and the acoustic velocity of primary order surface acoustic waves.

As is clear from FIG. 12, the acoustic velocity of the surface acoustic waves decreases as the thickness of the LN film increases in all of the cases where the propagation direction $\Psi$ is 0°, 5°, 10°, 20°, 40°, or 70°. However, it was discovered that when the thickness of the LN film is in the range about $0.9\lambda$ or lower, the acoustic velocity of the surface acoustic waves can be increased to about 4,000 m/second or more in all of the cases. Particularly, it was discovered that, over the range of the thickness of the LN film of about $0.9\lambda$ or lower, the acoustic velocity of the surface acoustic waves can be increased to about 4,400 m/second or more when $\Psi$ is lower than about 20° and preferably, by adjusting $\Psi$ to be about 10° or lower, the acoustic velocity of the surface acoustic waves can be increased to about 4,500 m/second or more.

Figure 13:
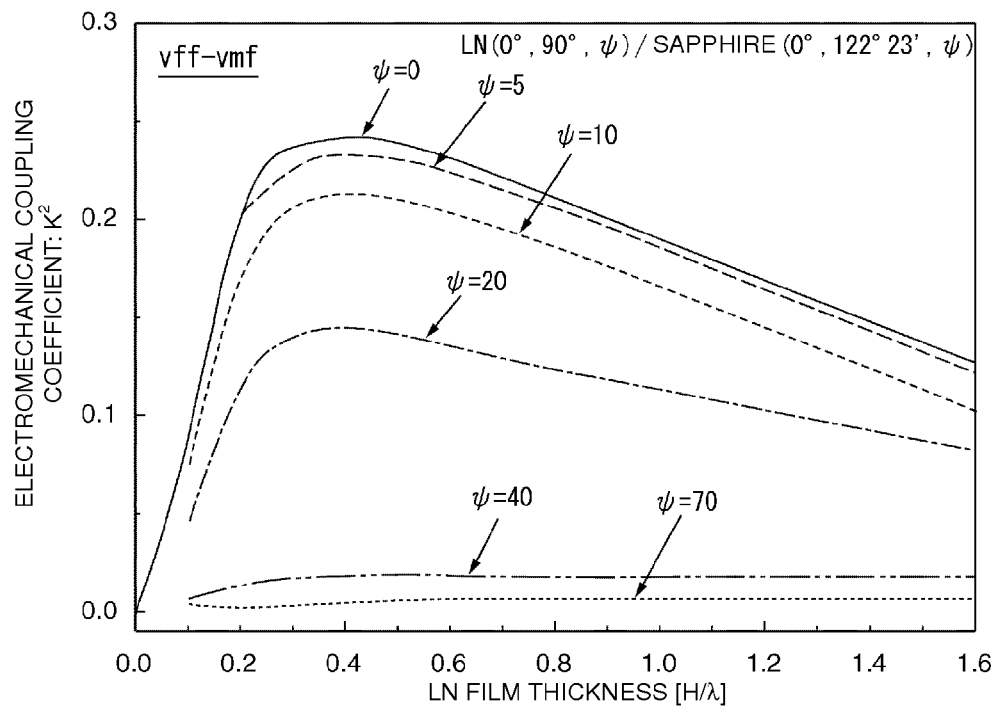
FIG. 13 is a view illustrating the relationship between the thickness of a LN film in a piezoelectric substrate containing (0°, 90°, Ψ) LN film/(0°, 122°23', Ψ) R-plane sapphire, the propagation direction Ψ, and the electromechanical coupling coefficient $k^2$ of primary order surface acoustic waves.

As is clear from FIG. 13, it was discovered that, by adjusting the propagation direction $\Psi$ to be lower than about 20°, a high electromechanical coupling coefficient $k^2$ is obtained. Preferably, the propagation direction $\Psi$ is preferably about 15° or lower. Thus, the electromechanical coupling coefficient $k^2$ can be increased. More preferably, FIG. 13 shows that, by adjusting the propagation direction $\Psi$ to about 10° or lower, a high electromechanical coupling coefficient $k^2$ can be obtained.

Therefore, as is clear from FIG. 10 to FIG. 13, it was discovered that, in the lamination structure of the $LiNbO_3$ with Euler angles $(0°, 90°, \Psi)$ and the sapphire with Euler angles $(0°, 122°23', \Psi)$, when the propagation direction $\Psi$ is lower than about 20°, preferably in the range of about 15° or lower, and more preferably in the range of about 10° or lower, the acoustic velocity of the surface acoustic waves can be increased and the electromechanical coupling coefficient $k^2$ can be effectively increased.

Even when the propagation direction $\Psi$ is a negative value, the same results when the direction $\Psi$ is a positive value are obtained. Therefore, it was discovered that the Euler angles of the R-plane sapphire may preferably be in the range of $(0°, 122°23', 0°\pm15°)$, in other words in the range of $(0°, 122°23', -15°$ to $15°)$, and more preferably in the range of $(0-, 122°23', -5°$ to $5°)$.

More specifically, the electromechanical coupling coefficient $k^2$ can be effectively increased by adjusting the film thickness of the LN film in the range of about $0.1\lambda$ to about $1.6\lambda$ when the Euler angle $\Psi$ is about $-5°$ or more and about $+5°$ or lower and by adjusting the film thickness in the range of about $0.18\lambda$ to about $0.75\lambda$ when $\Psi$ is about $-15°$ or more and lower than about $-5°$ or larger than about $+5°$ and about $+15°$ or larger.

As described above, the present inventors have discovered that when a piezoelectric substrate in which a LN film with Euler angles $(90°, 90°, 0°)$ or $(0°, 90°, 0°)$ is laminated on an R-plane sapphire with Euler angles $(0°, 122°23', -15°$ to $15°)$ is used, an increase in the acoustic velocity and an increase in the electromechanical coupling coefficient k2 of surface acoustic waves can be achieved. Furthermore, it was discovered that when Al is used as electrodes, the reflection coefficient or the electromechanical coupling coefficient k2 can be increased by adjusting the thickness of an Al film in a specific range.

Figure 14:
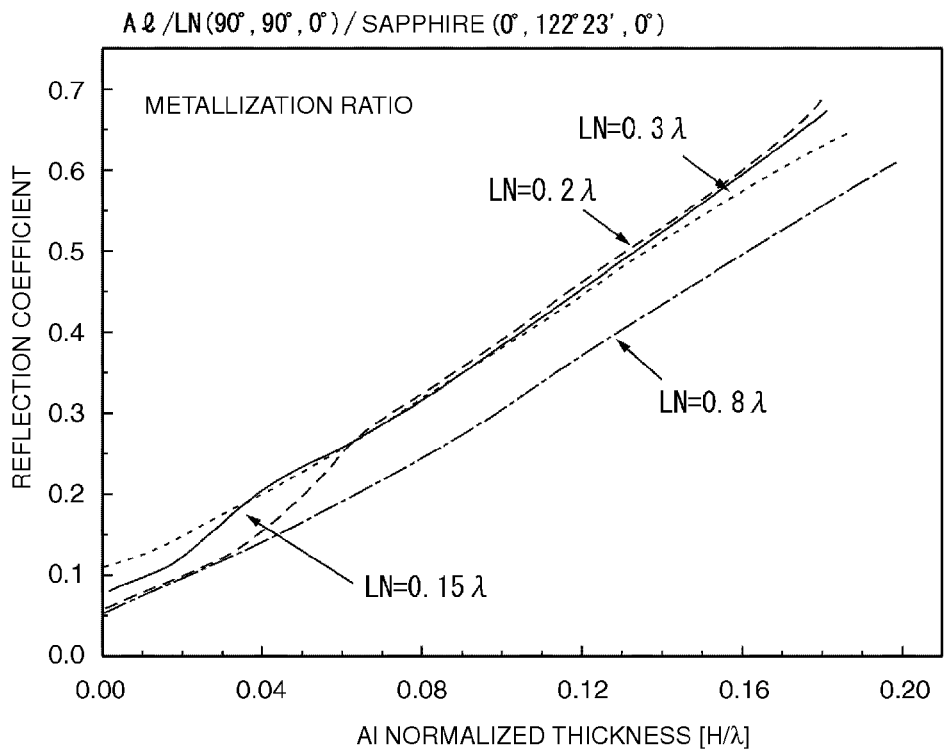
FIG. 14 is a view illustrating the relationship, in a primary order surface acoustic wave device in which Al film interdigital electrodes are laminated on a piezoelectric substrate containing (90°, 90°, 0°) LN film/(0°, 122°23', 0°) R-plane sapphire, between the thickness of the LN film, the thickness of the Al film interdigital electrodes, and the reflection coefficient.
Figure 15:
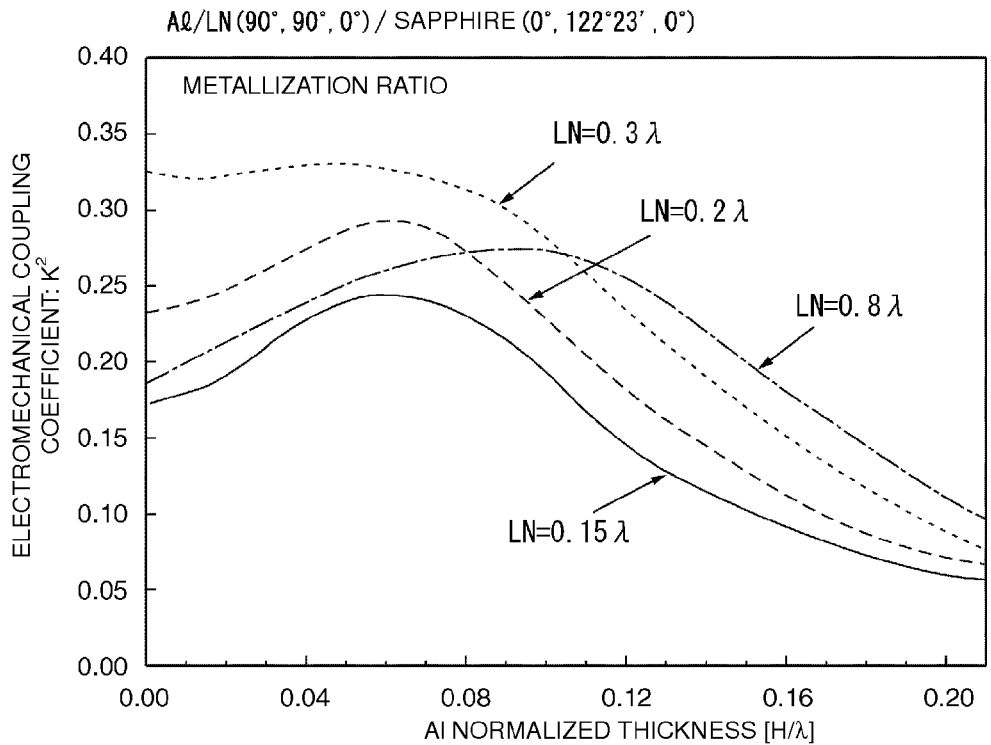
FIG. 15 is a view illustrating the relationship, in a primary order surface acoustic wave device in which Al film interdigital electrodes are laminated on a piezoelectric substrate containing (90°, 90°, 0°) LN film/(0°, 122°23', 0°) R-plane sapphire, between the thickness of the LN film, the thickness of the Al film interdigital electrodes, and the electromechanical coupling coefficient $k^2$.

FIG. 14 and FIG. 15 are a view illustrating the relationship, in a surface acoustic wave device in which an Al film is laminated on a piezoelectric substrate containing LN film with Euler angles $(90°, 90°, 0°)$ R-plane sapphire with Euler angles $(0°, 122°23', 0°)$, between the thickness of the Al film, the thickness of the LN film, and the reflection coefficient and a view illustrating the relationship between the thickness of the Al film, the thickness of the LN film, and the electromechanical coupling coefficient $k^2$, respectively. FIG. 14 and FIG. 15 show the results about primary order surface acoustic waves.

In FIG. 14 and FIG. 15, the metallization ratio of the electrodes made of Al was set to about 0.5.

As is clear from FIG. 14, it was discovered that the reflection coefficient becomes higher as the thickness of the Al film increases in all of the cases where the thickness of the LN film is about 0.15λ, about 0.2λ, about 0.3λ, or about 0.8λ. In particular, FIG. 15 shows that the electromechanical coupling coefficient $k^2$ can be as high as about 0.08 or more when the thickness of the Al film is about 0.02λ or more and about 0.16λ or lower.

Therefore, it was discovered that, in order to obtain a high reflection coefficient of about 0.1 or more and an electromechanical coupling coefficient $k^2$ of about 0.08 or more, the thickness of the Al film may be adjusted in the range of about 0.02λ to about 0.16λ. More preferably, it was discovered that, by adjusting the thickness of the Al film in the range of about 0.04 or more and about 0.14 or lower, a reflection coefficient of about 0.15 or more can be achieved and an electromechanical coupling coefficient $k^2$ of about 0.1 or more can be achieved.

Figure 16:
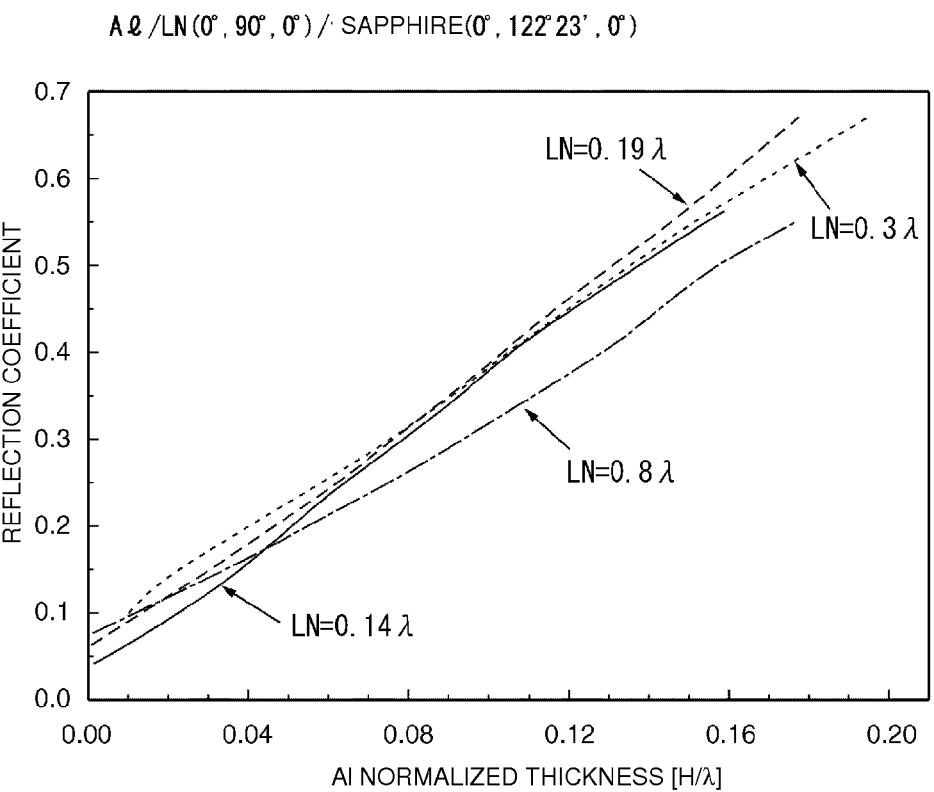
FIG. 16 is a view illustrating the relationship, in a primary order surface acoustic wave device in which Al film interdigital electrodes are laminated on a piezoelectric substrate containing (0°, 90°, 0°) LN film/(0°, 122°23', 0°) R-plane sapphire, between the thickness of the LN film, the thickness of the Al film interdigital electrodes, and the reflection coefficient.
Figure 17:
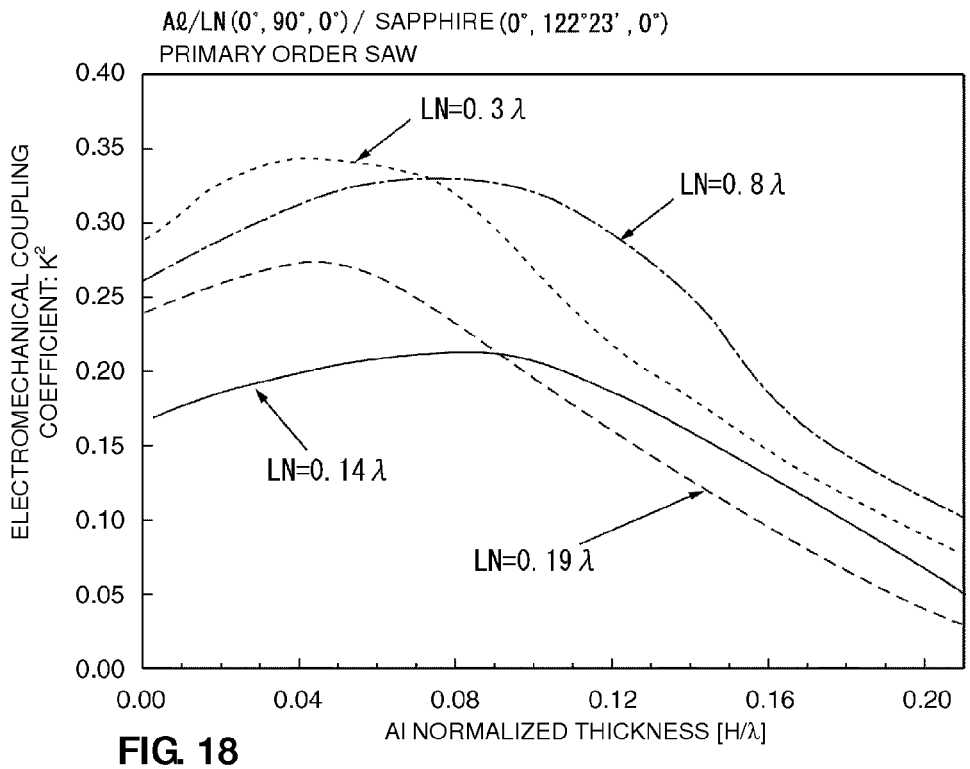
FIG. 17 is a view illustrating the relationship, in a primary order surface acoustic wave device in which Al film interdigital electrodes are laminated on a piezoelectric substrate containing (0°, 90°, 0°) LN film/(0°, 122°23', 0°) R-plane sapphire, between the thickness of the LN film, the thickness of the Al film interdigital electrodes, and the electromechanical coupling coefficient $k^2$.

FIG. 16 and FIG. 17 are views illustrating the relationship, in a surface acoustic wave device in which an Al film is laminated on a piezoelectric substrate containing LN film with Euler angles (0°, 90°, 0°)/R-plane sapphire with Euler angles (0°, 122°23', 0°), between the thickness of the Al film, the thickness of the LN film, and the reflection coefficient and a view illustrating the relationship between the thickness of the Al film, the thickness of the LN film, and the electromechanical coupling coefficient $k^2$, respectively. FIG. 16 and FIG. 17 show the results about primary order surface acoustic waves.

In FIG. 16 and FIG. 17, the metallization ratio of the electrodes made of Al was set to about 0.5.

As is clear from FIG. 16, it was discovered that the reflection coefficient becomes higher as the thickness of the Al film increases in all of the cases where the thickness of the LN film is about 0.14λ, about 0.19λ, about 0.3λ, or about 0.8λ. In particular, FIG. 17 shows that the electromechanical coupling coefficient $k^2$ can be as high as about 0.1 or more when the thickness of the Al film is about 0.02λ or more and about 0.16λ or lower.

Therefore, it was discovered that, in order to obtain a high reflection coefficient of about 0.1 and an electromechanical coupling coefficient $k^2$ of about 0.1 or more, the thickness of the Al film may be adjusted in the range of about 0.02λ to about 0.16λ. More preferably, it was discovered that, by adjusting the thickness of the Al film in the range of about 0.04λ or more and about 0.13λ or lower, a reflection coefficient of about 0.15 or more can be achieved and an electromechanical coupling coefficient $k^2$ of about 0.15 or more can be achieved.

Figure 18:
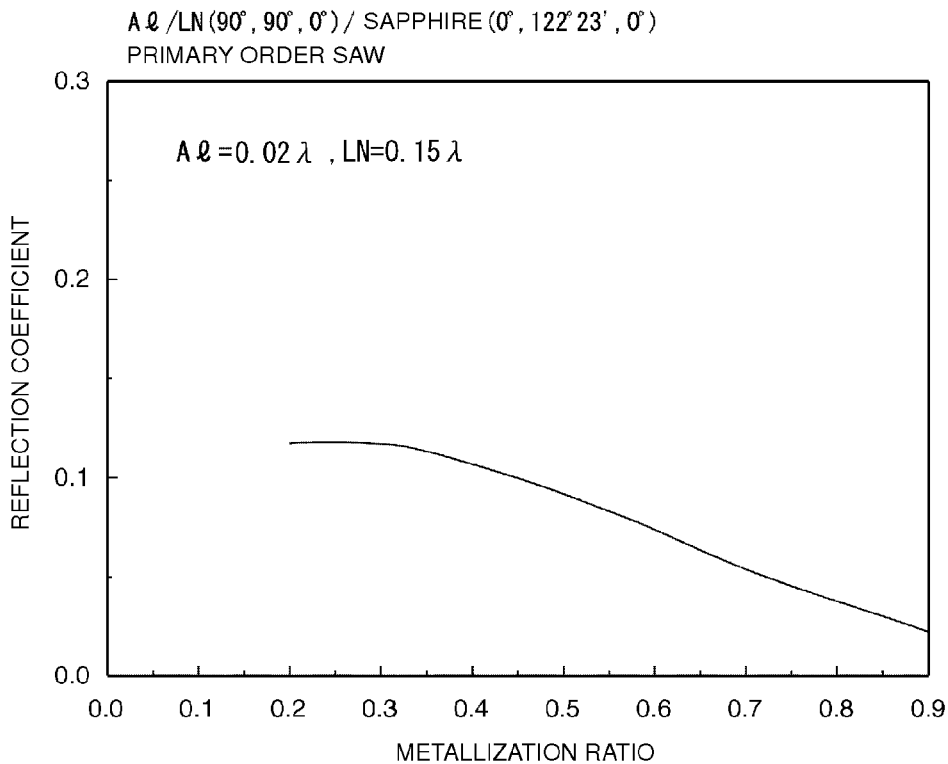
FIG. 18 is a view illustrating the relationship, in a surface acoustic wave device in which the thickness of a LN film is about 0.15λ in a piezoelectric substrate containing (90°, 90°, 0°) LN film/(0°, 122°23', 0°) R-plane sapphire and the thickness of Al film interdigital electrodes disposed on the piezoelectric substrate is about 0.02λ, between the metallization ratio of the electrodes and the reflection coefficient.
Figure 19:
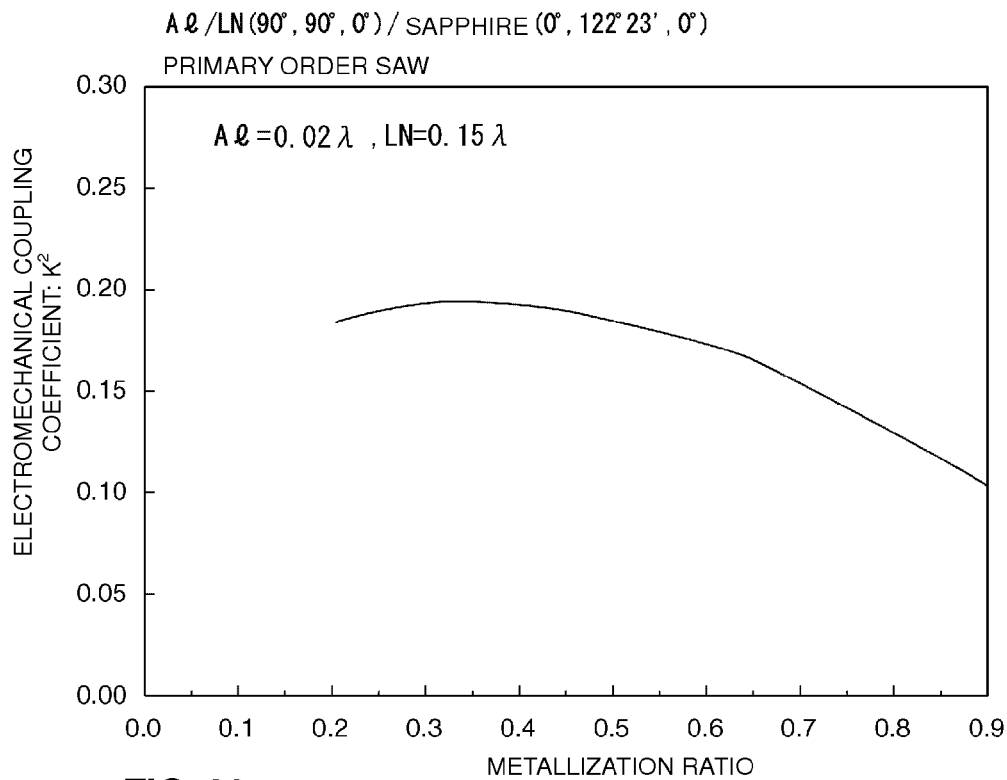
FIG. 19 is a view illustrating the relationship, in a surface acoustic wave device in which the thickness of a LN film is about 0.15λ in a piezoelectric substrate containing (90°, 90°, 0°) LN film/(0°, 122°23', 0°) R-plane sapphire and the thickness of Al film interdigital electrodes disposed on the piezoelectric substrate is about 0.02λ, between the metallization ratio of the electrodes and the electromechanical coupling coefficient $k^2$.

FIG. 18 and FIG. 19 are views illustrating the relationship, in a surface acoustic wave device in which an LN film is about 0.15λ and electrodes made of an approximately 0.02λ Al film are disposed on a piezoelectric substrate containing LN film with Euler angles (90°, 90°, 0°)/R-plane sapphire with Euler angles (0°, 122°23', 0°), between the metallization ratio of the electrodes and the reflection coefficient and between the metallization ratio and the electromechanical coupling coefficient $k^2$, respectively.

As is clear from FIG. 18, the reflection coefficient tends to decrease as an increase in the metallization ratio. Though, as is clear from FIG. 19 and FIG. 18, it was discovered that, when the metallization ratio is in the range of about 0.2 to about 0.7, the electromechanical coupling coefficient $k^2$ can be as high as about 0.16 or more while increasing the reflection coefficient to about 0.06 or more. More specifically, it was discovered that, by adjusting the metallization ratio in the range of about 0.2 to about 0.7, the reflection coefficient can be increased and further a sufficient electromechanical coupling coefficient $k^2$ can be achieved. More preferably, the metallization ratio is in the range of about 0.2 to about 0.65. In such a case, it was discovered that the reflection coefficient can be further increased to about 0.07 or more and the electromechanical coupling coefficient $k^2$ can be further increased to about 0.17 or more.

Figure 20:
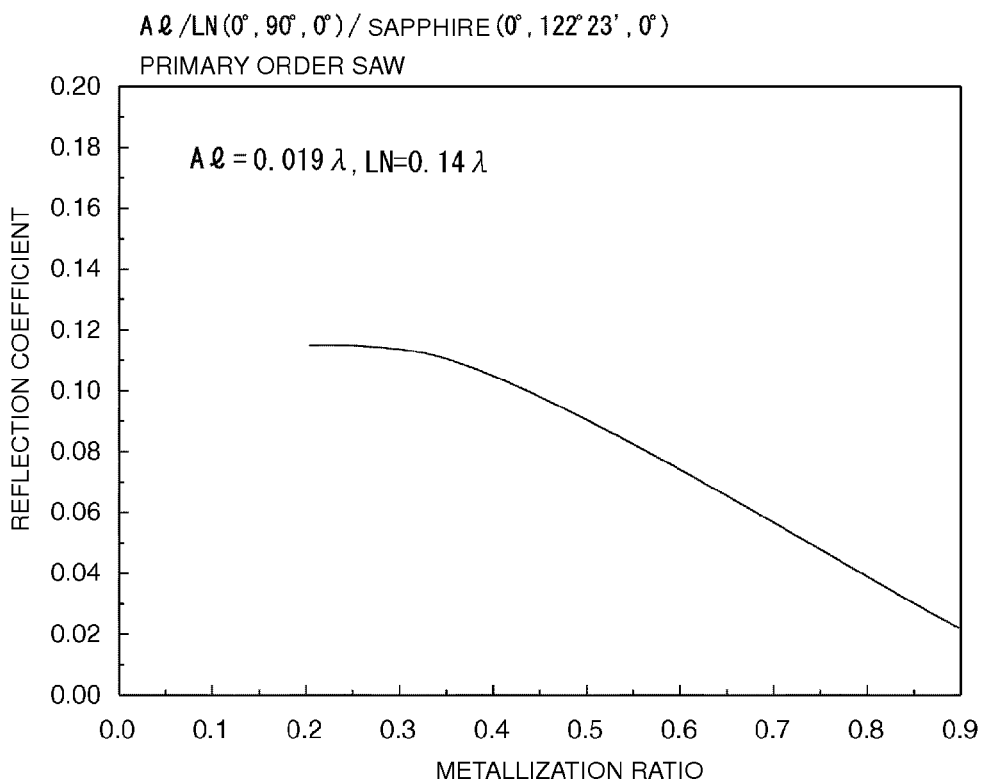
FIG. 20 is a view illustrating the relationship, in a surface acoustic wave device in which the thickness of a LN film is about 0.14λ in a piezoelectric substrate containing (0°, 90°, 0°) LN film/(0°, 122°23', 0°) R-plane sapphire and the thickness of Al film interdigital electrodes disposed on the piezoelectric substrate is about 0.019λ, between the metallization ratio of the electrodes and the reflection coefficient.
Figure 21:
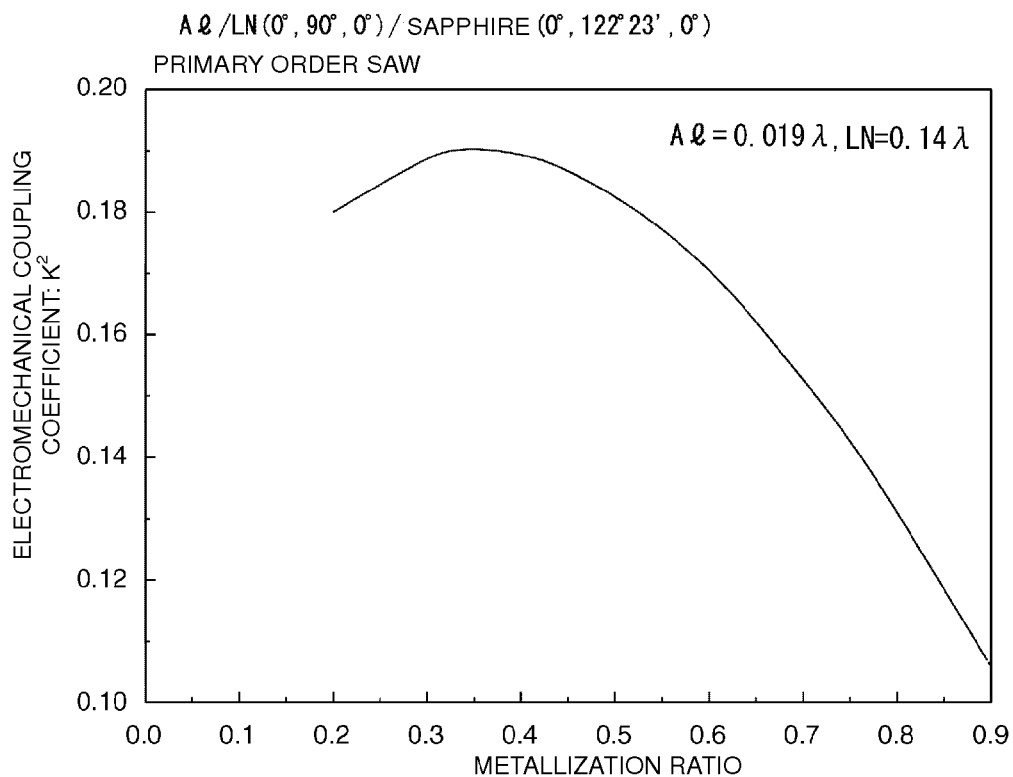
FIG. 21 is a view illustrating the relationship, in a surface acoustic wave device in which the thickness of a LN film is about 0.14λ in a piezoelectric substrate containing (0°, 90°, 0°) LN film/(0°, 122°23', 0°) R-plane sapphire and the thickness of Al film interdigital electrodes disposed on the piezoelectric substrate is about 0.019λ, between the metallization ratio of the electrodes and the electromechanical coupling coefficient $k^2$.

FIG. 20 and FIG. 21 are views illustrating the relationship, in a surface acoustic wave device in which a LN film is about 0.14λ and electrodes made of an approximately 0.019λ Al film are disposed on a piezoelectric substrate containing LN film with Euler angles (0°, 90°, 0°)/R-plane sapphire with Euler angles (0°, 122°23', 0°), between the metallization ratio of the electrodes and the reflection coefficient and between the metallization ratio and the electromechanical coupling coefficient $k^2$, respectively.

As is clear from FIG. 20, the reflection coefficient tends to decrease as the metallization ratio increases. Though, as is clear from FIG. 20 and FIG. 21, it was discovered that, when the metallization ratio is in the range of about 0.2 to about 0.7, the electromechanical coupling coefficient $k^2$ can be as high as about 0.155 or more while increasing the reflection coefficient to about 0.06 or more. More specifically, it was discovered that, by adjusting the metallization ratio in the range of about 0.2 to about 0.7, the reflection coefficient can be increased and further a sufficient electromechanical coupling coefficient $k^2$ can be achieved. More preferably, the metallization ratio is preferably in the range of about 0.2 to about 0.62. In such a case, it was discovered that the reflection coefficient can be further increased to about 0.07 or more and the electromechanical coupling coefficient $k^2$ can be further increased to about 0.17 or more.

Figure 22:
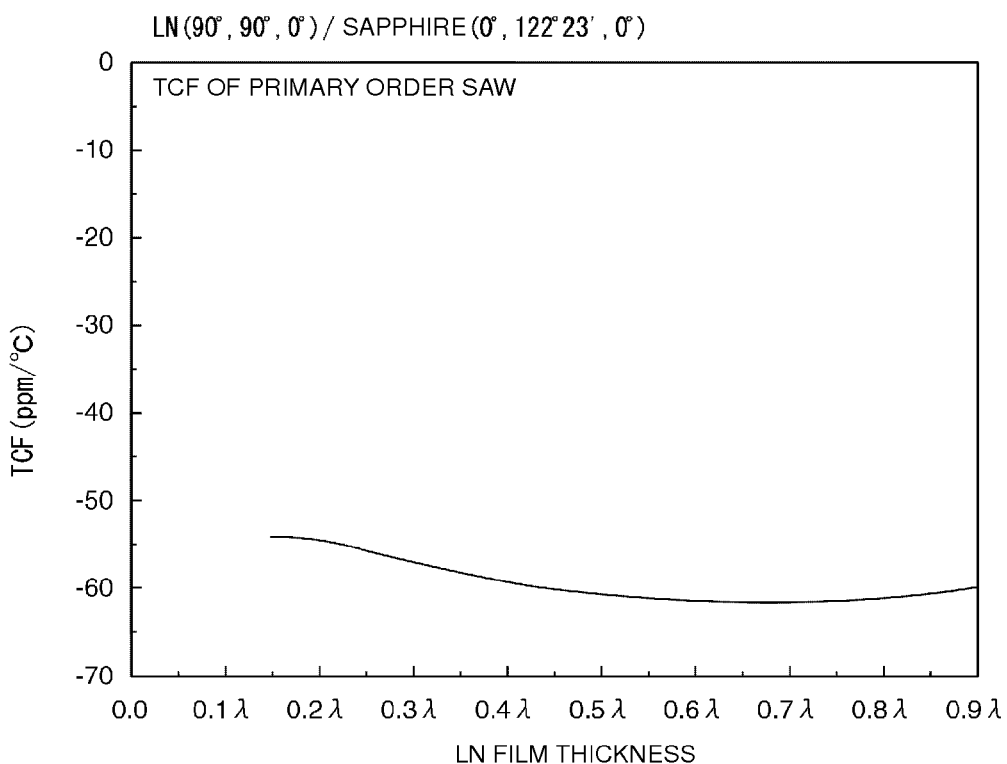
FIG. 22 is a view illustrating the relationship between the thickness of a LN film and the frequency temperature coefficient TCF in a piezoelectric substrate containing (90°, 90°, 0°) LN film/(0°, 122°23', 0°) R-plane sapphire.

FIG. 22 is a view illustrating the relationship between the thickness of a LN film of a piezoelectric substrate containing LN film with Euler angles (90°, 90°, 0°)/R-plane sapphire with Euler angles (0°, 122°23', 0°) and the temperature coefficient of frequency TCF of a primary order surface acoustic wave.

As is clear from FIG. 22, it was discovered that, even when the film thickness of the LN film is changed in the above-described preferable film thickness range of about 0.13λ to about 0.8λ, the TCF hardly changes. Therefore, it was discovered that the characteristics hardly change even when the film thickness of the LN film is changed.

Figure 23:
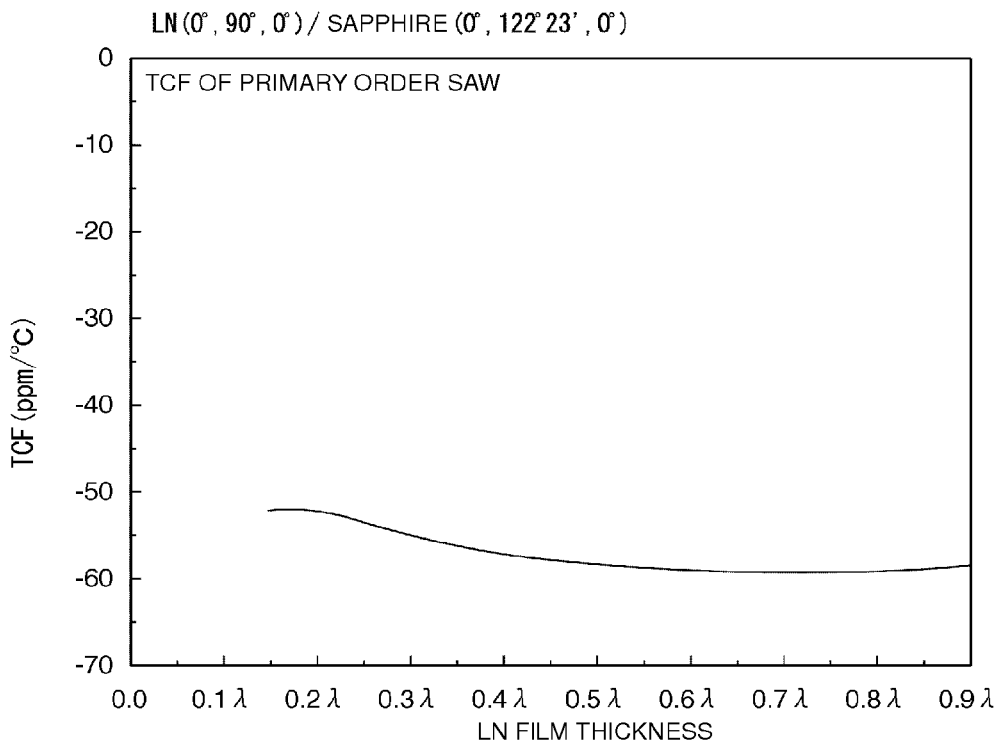
FIG. 23 is a view illustrating the relationship between the thickness of a LN film and the temperature coefficient of frequency TCF in a piezoelectric substrate containing (0°, 90°, 0°) LN film/(0°, 122°23', 0°) R-plane sapphire.

FIG. 23 is a view illustrating the relationship between the thickness of a LN film of a piezoelectric substrate containing LN film with Euler angles (0°, 90°, 0°)/R-plane sapphire with Euler angles (0°, 122°23', 0°) and the temperature coefficient of frequency TCF of a surface acoustic wave.

As is clear from FIG. 23, it was discovered that, even when the film thickness of the LN film is changed in the above-described preferable film thickness range of about 0.13λ to about 0.8λ, the TCF hardly changes. Therefore, it was discovered that the characteristics hardly change even when the film thickness of the LN film is changed.

The present inventors have discovered that, even when an a-plane sapphire is used in place of the R-plane sapphire, an increase in the acoustic velocity of surface acoustic waves and an increase in the electromechanical coupling coefficient $k^2$ can be achieved by adjusting the crystal orientation of the LN film in a specific direction.

Figure 24:
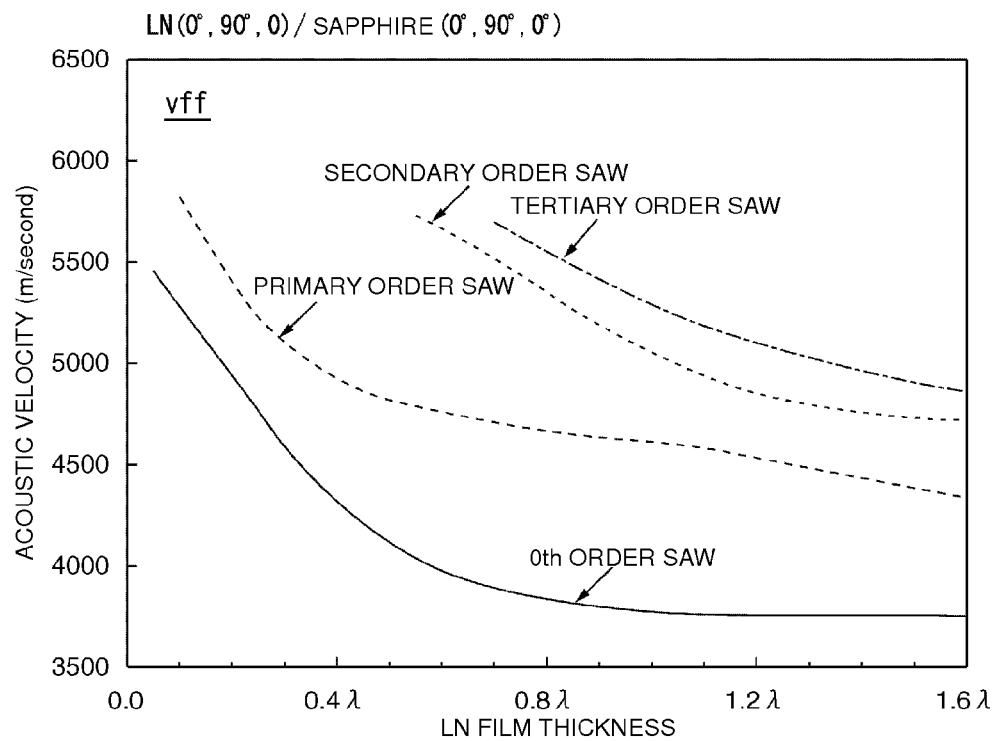
FIG. 24 is a view illustrating the relationship between the thickness of a LN film in a piezoelectric substrate containing (0°, 90°, 0°) LN film/(0°, 90°, 0°) a-plane sapphire and the acoustic velocity of surface acoustic waves.
Figure 25:
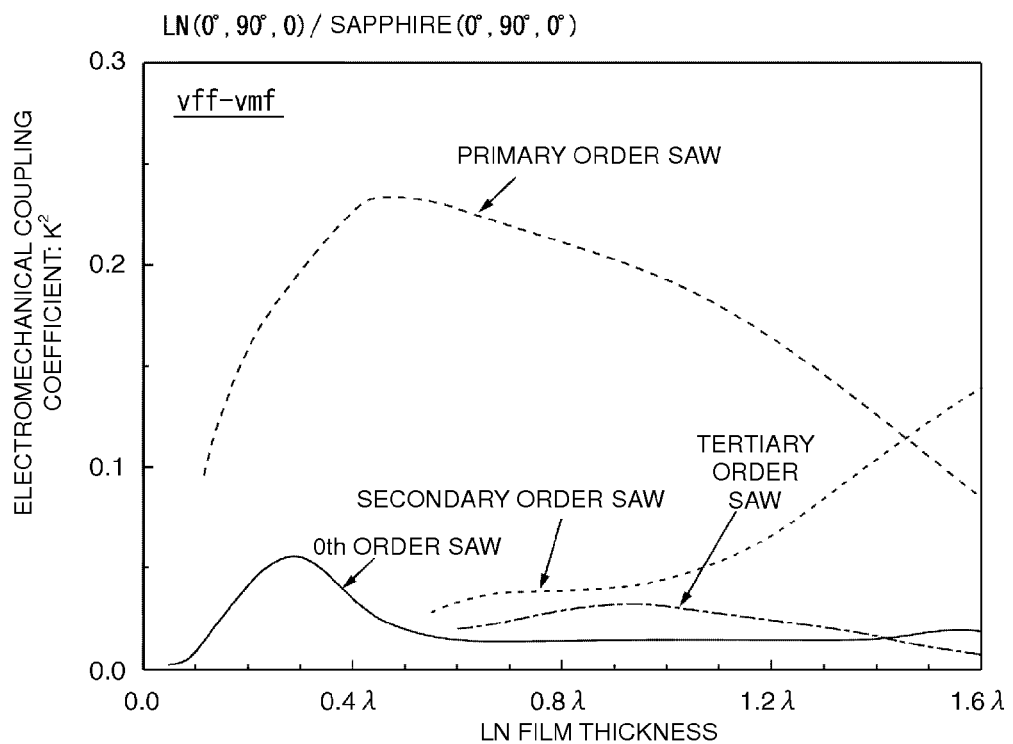
FIG. 25 is a view illustrating the relationship between the thickness of a LN film in a piezoelectric substrate containing (0°, 90°, 0°) LN film/(0°, 90°, 0°) a-plane sapphire and the electromechanical coupling coefficient $k^2$ of surface acoustic waves.

FIG. 24 and FIG. 25 are views illustrating the relationship, in a piezoelectric substrate containing LN film with Euler angles (0°, 90°, 0°)/a-plane sapphire with Euler angles (0°, 90°, 0°), between the thickness of the LN film and the acoustic velocity of surface acoustic waves or the electromechanical coupling coefficient $k^2$, respectively.

As is clear from FIG. 24, when primary order, secondary order, and tertiary order surface acoustic waves are used, the acoustic velocity of the surface acoustic waves can be increased regardless of the film thickness of the LN film when the film thickness of the LN film is in the range of about 1.6λ or lower as compared with the case of a 0th order surface acoustic wave.

Over the range of the film thickness of the LN film of about 1.6λ or lower, an acoustic velocity of about 4,500 m/second or more is obtained in the case of the primary order surface acoustic wave, an acoustic velocity of about 4,800 m/second or more is obtained in the case of the secondary order surface acoustic wave, and an acoustic velocity of about 5,100 m/second or more is obtained in the case of the tertiary order surface acoustic wave.

In contrast, as is clear from FIG. 25, it was discovered that, the electromechanical coupling coefficient $k^2$ can be increased to about 0.1 or more over the range of the film thickness of the LN film of about 0.1λ or more and about 1.6λ or lower when the primary order surface acoustic wave is used.

Moreover, it was discovered that when the secondary order surface acoustic wave is used, the electromechanical coupling coefficient $k^2$ can be increased to about 0.025 or more by adjusting the film thickness of the LN film in the range of about 0.5λ or more and about 1.6λ or lower. It was discovered that when the tertiary order surface acoustic wave is used, the electromechanical coupling coefficient $k^2$ can be increased to about 0.02 or more by adjusting the film thickness of the LN film in the range of about 0.6λ or more and about 1.6λ or lower.

Figure 26:
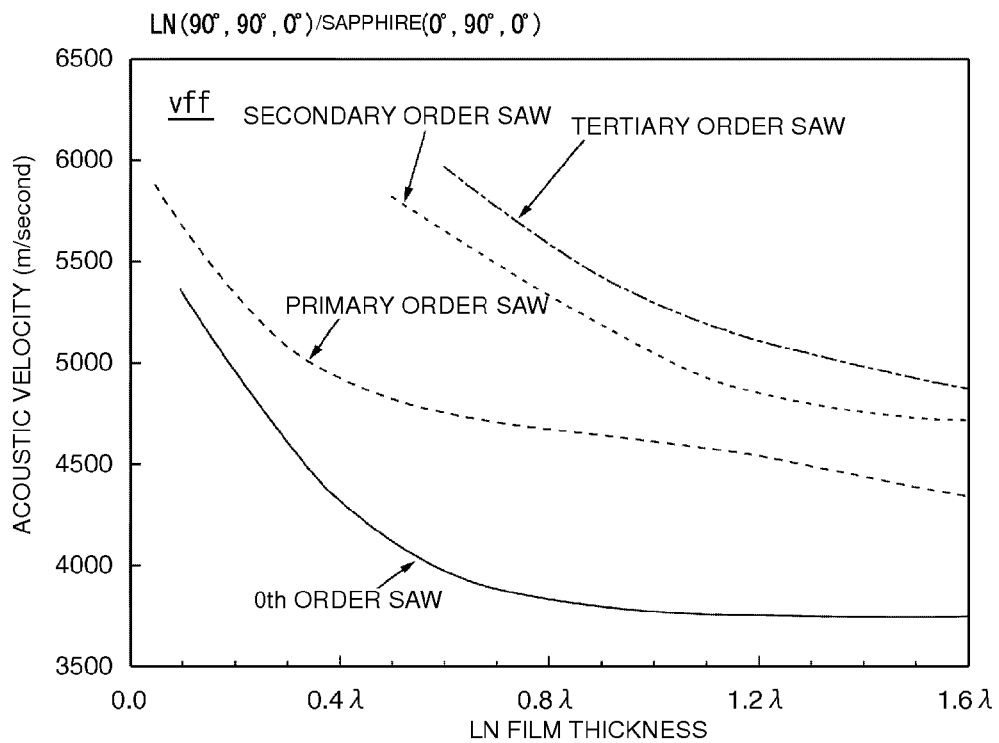
FIG. 26 is a view illustrating the relationship between the thickness of a LN film in a piezoelectric substrate containing (90°, 90°, 0°) LN film/(0°, 90°, 0°) a-plane sapphire and the acoustic velocity of surface acoustic waves.
Figure 27:
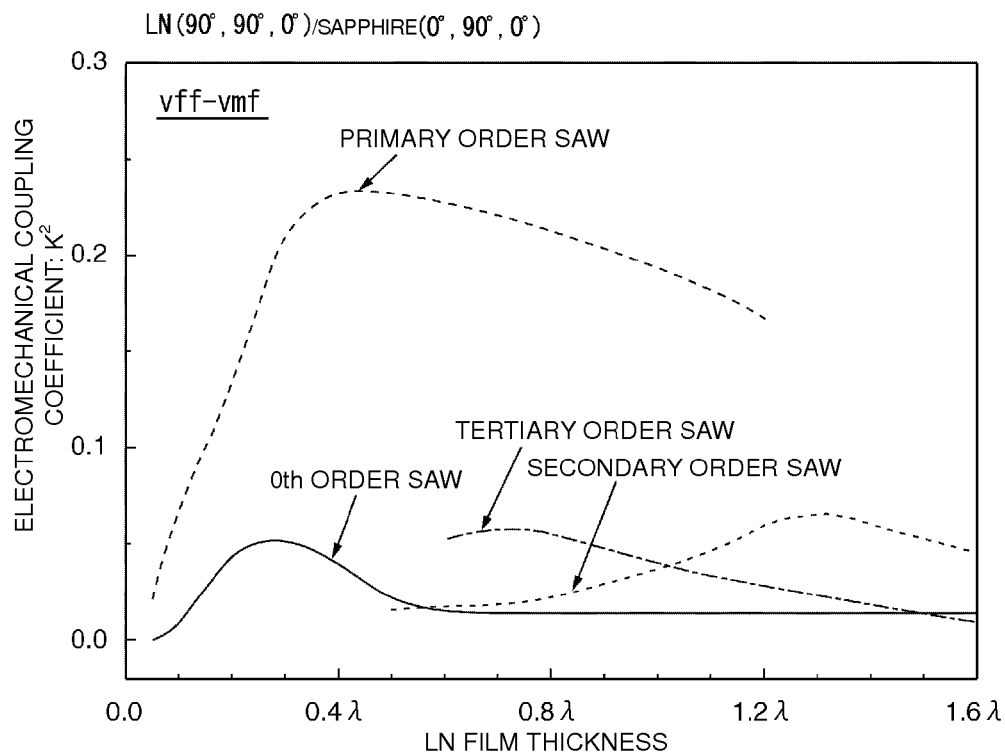
FIG. 27 is a view illustrating the relationship between the thickness of a LN film in a piezoelectric substrate containing (90°, 90°, 0°) LN film/(0°, 90°, 0°) a-plane sapphire and the electromechanical coupling coefficient $k^2$ of surface acoustic waves.

FIG. 26 and FIG. 27 are views illustrating the relationship, in a piezoelectric substrate containing LN film with Euler angles (90°, 90°, 0°)/a-plane sapphire with Euler angles (0°, 90°, 0°), between the thickness of the LN film and the acoustic velocity of surface acoustic waves or between the thickness and the electromechanical coupling coefficient $k^2$, respectively.

As is clear from FIG. 26, when primary order, secondary order, and tertiary order surface acoustic waves are used, the acoustic velocity of the surface acoustic waves can be increased regardless of the film thickness of the LN film when the film thickness of the LN film is in the range of about 1.6λ or lower as compared with the case of a 0th order surface acoustic wave.

Over the range of range of the film thickness of the LN film of about 1.6λ or lower, an acoustic velocity of about 4,500 m/second or more is obtained in the case of the primary order surface acoustic wave, an acoustic velocity of about 4,800 m/second or more is obtained in the case of the secondary order surface acoustic wave, and an acoustic velocity of about 5,100 m/second or more is obtained in the case of the tertiary order surface acoustic wave.

In contrast, as is clear from FIG. 27, it was discovered that when the primary order surface acoustic wave is used, the electromechanical coupling coefficient $k^2$ can be increased to about 0.1 or more over the range of the film thickness of the LN film of about 0.1λ or more and about 1.6λ or lower. It was discovered that when the secondary order surface acoustic wave is used, the electromechanical coupling coefficient $k^2$ can be increased to about 0.02 or more by adjusting the film thickness of the LN film in the range of about 0.5λ or more and about 1.6λ or lower. It was discovered that when the tertiary order surface acoustic wave is used, the electromechanical coupling coefficient $k^2$ can be increased to about 0.02 or more by adjusting the film thickness of the LN film in range of about 0.6λ or more and about 1.6λ or lower.

The present inventors have discovered that, also in the case where a piezoelectric substrate is used in which a LN film is laminated on an m-plane sapphire, besides the R-plane sapphire or the a-plane sapphire, i.e., a sapphire substrate with Euler angles (90°, 90°, 0°), a high electromechanical coupling coefficient and a high acoustic velocity can be obtained by adjusting the crystal orientation of the LN film in a specific direction.

Figure 28:
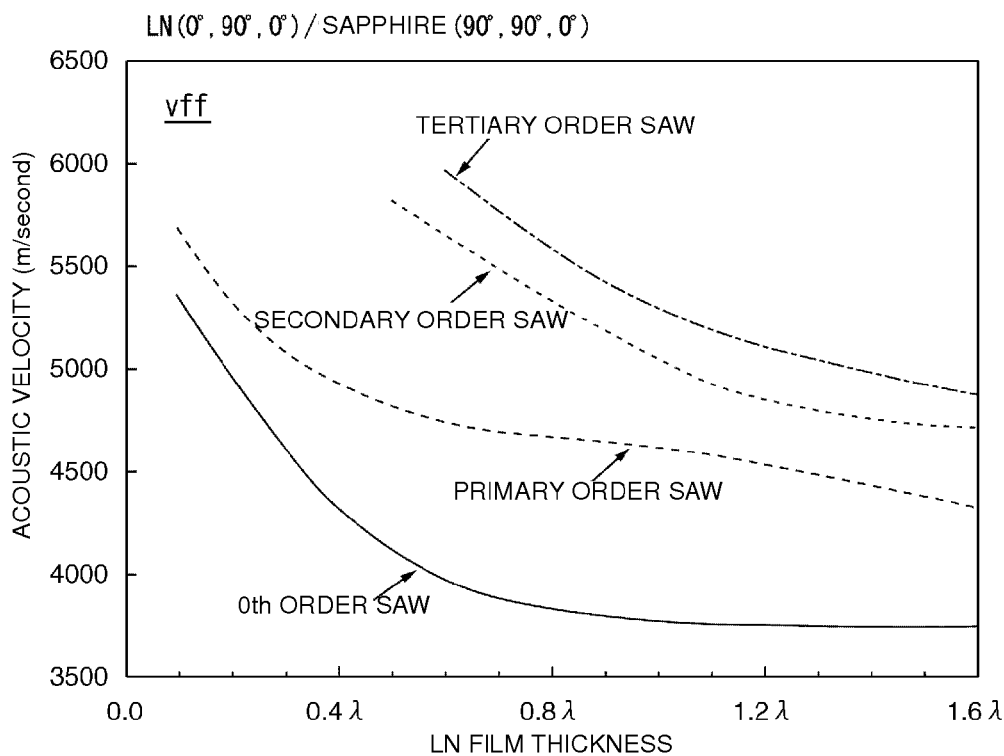
FIG. 28 is a view illustrating the relationship between the thickness of a LN film in a piezoelectric substrate containing (0°, 90°, 0°) LN film/(90°, 90°, 0°) m-plane sapphire and the acoustic velocity of surface acoustic waves.
Figure 29:
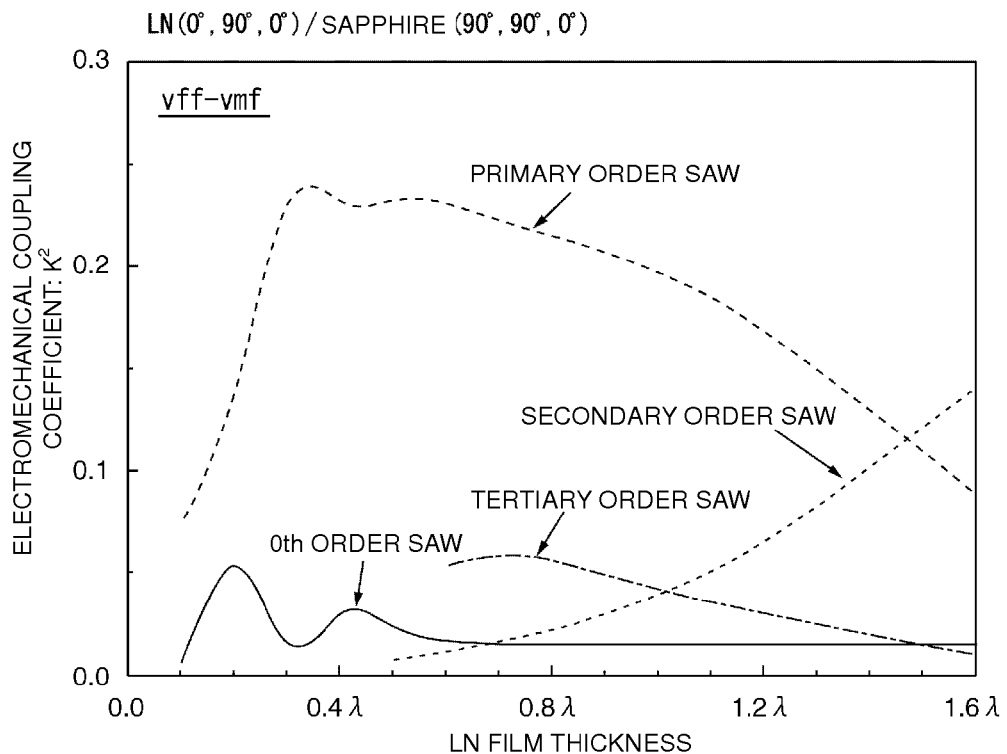
FIG. 29 is a view illustrating the relationship between the thickness of a LN film in a piezoelectric substrate containing (0°, 90°, 0°) LN film/(90°, 90°, 0°) m-plane sapphire and the electromechanical coupling coefficient $k^2$ of surface acoustic waves.

FIG. 28 and FIG. 29 are views illustrating the relationship, in a piezoelectric substrate containing LN film with Euler angles (0°, 90°, 0°)/m-plane sapphire with Euler angles (90°, 90°, 0°), between the thickness of the LN film and the acoustic velocity of surface acoustic waves or between the thickness and the electromechanical coupling coefficient $k^2$ of surface acoustic waves, respectively.

As is clear from FIG. 28, when primary order, secondary order, and tertiary order surface acoustic waves are used, the acoustic velocity of the surface acoustic waves can be increased regardless of the film thickness of the LN film when the film thickness of the LN film is in the range of about 1.6λ or lower as compared with the case of a 0th order surface acoustic wave.

Over the range of range of the film thickness of the LN film of about 1.6λ or lower, an acoustic velocity of about 4,500 m/second or more is obtained in the case of the primary order surface acoustic wave, an acoustic velocity of about 4,800 m/second or more is obtained in the case of the secondary order surface acoustic wave, and an acoustic velocity of about 5,100 m/second or more is obtained in the case of the tertiary order surface acoustic wave.

In contrast, as is clear from FIG. 29, it was discovered that the electromechanical coupling coefficient $k^2$ can be increased to about 0.1 or more over the range of the film thickness of the LN film of about 0.1λ or more and about 1.6λ or lower when the primary order surface acoustic wave is used. Moreover, it was discovered that when the secondary order surface acoustic wave is used, the electromechanical coupling coefficient $k^2$ can be increased to about 0.02 or more by adjusting the film thickness of the LN film in the range of about 0.5λ or more and about 1.6λ or lower. It was discovered that when the tertiary order surface acoustic wave is used, the electromechanical coupling coefficient $k^2$ can be increased to about 0.015 or more by adjusting the film thickness of the LN film in the range of about 0.6λ or more and about 1.6λ or lower.

Figure 30:
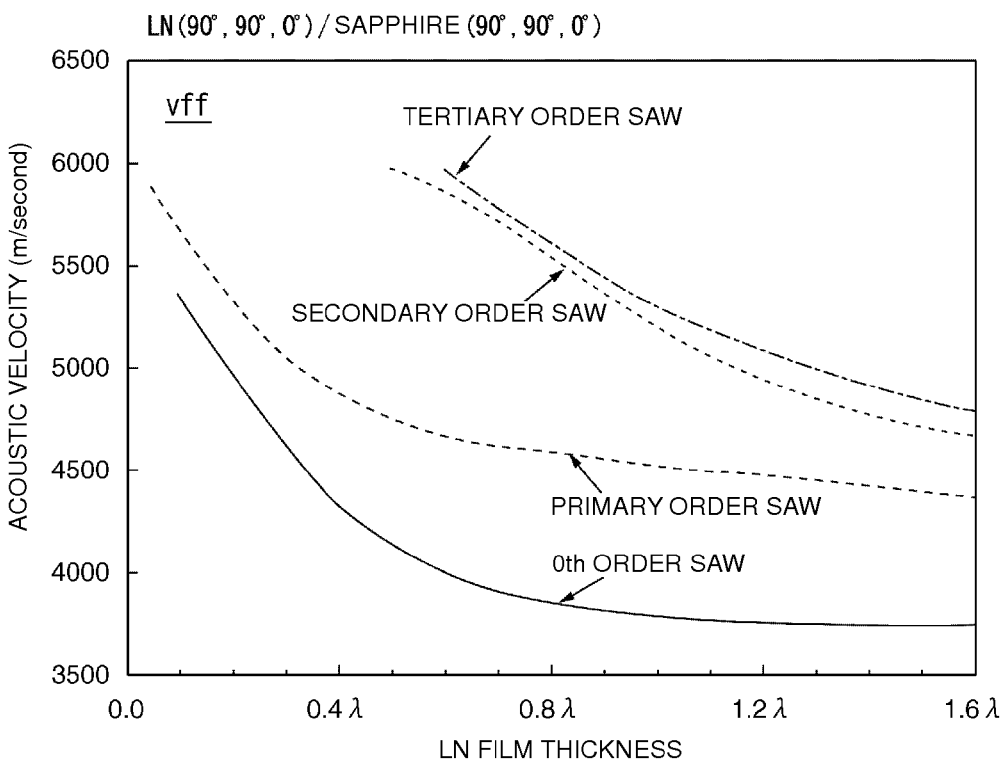
FIG. 30 is a view illustrating the relationship between the thickness of a LN film in a piezoelectric substrate containing (90°, 90°, 0°) LN film/(90°, 90°, 0°) m-plane sapphire and the acoustic velocity of surface acoustic waves.
Figure 31:
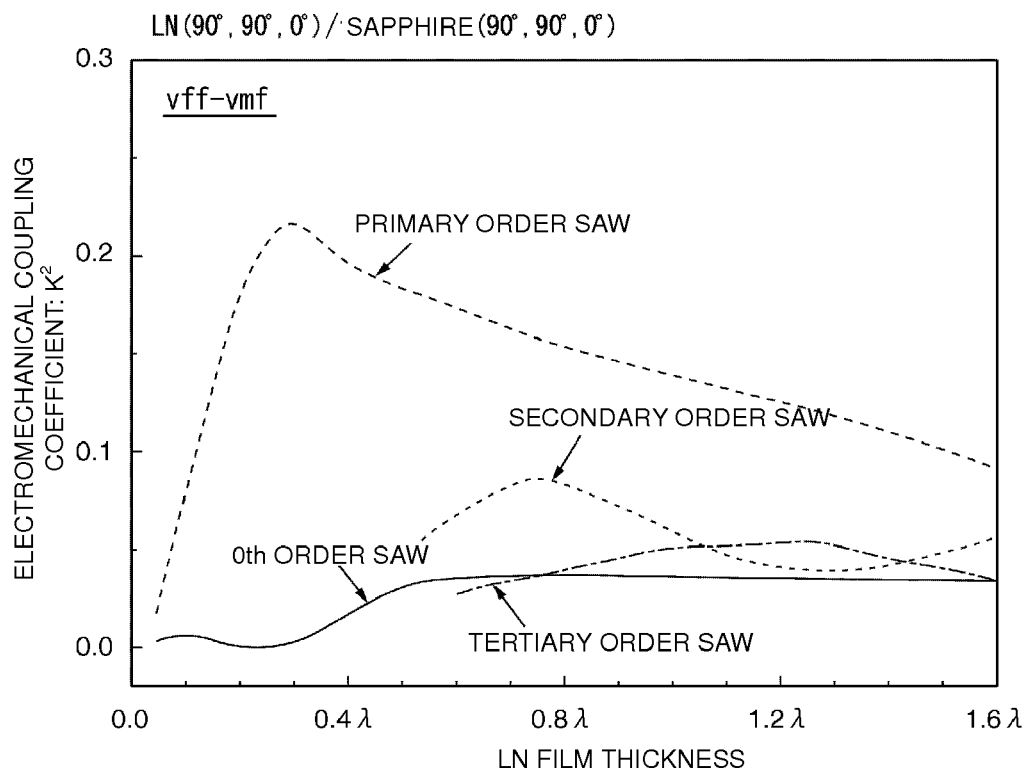
FIG. 31 is a view illustrating the relationship between the thickness of a LN film in a piezoelectric substrate containing (90°, 90°, 0°) LN film/(90°, 90°, 0°) m-plane sapphire and the electromechanical coupling coefficient $k^2$ of surface acoustic waves.
Figure 32:
FIG. 32 is a perspective view illustrating a conventional surface acoustic wave device.
Figure 32:
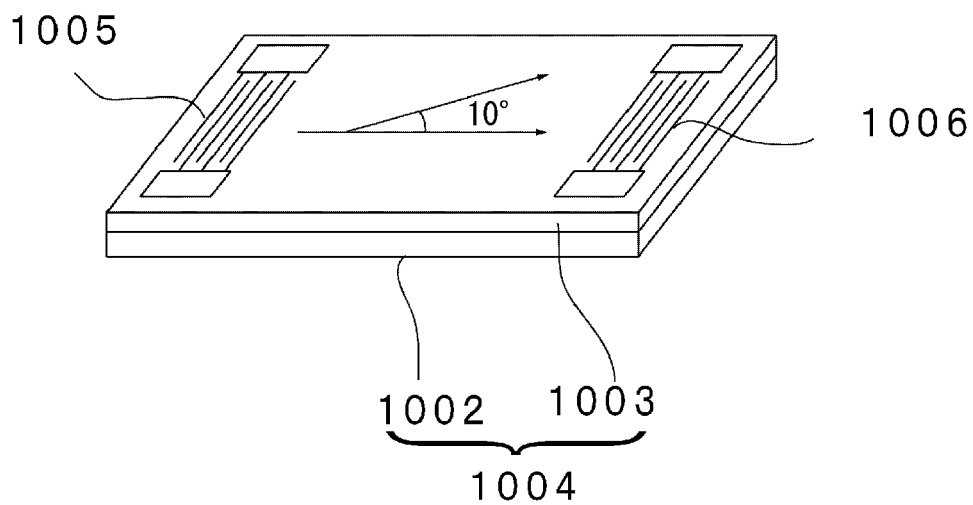

FIG. 30 and FIG. 31 are views illustrating the relationship, in a piezoelectric substrate containing LN film with Euler angles (90°, 90°, 0°)/m-plane sapphire with Euler angles (90°, 90°, 0°), between the thickness of the LN film and the acoustic velocity of surface acoustic waves or between the thickness and the electromechanical coupling coefficient $k^2$, respectively.

As is clear from FIG. 30, when primary order, secondary order, and tertiary order surface acoustic waves are used, the acoustic velocity of the surface acoustic waves can be increased regardless of the film thickness of the LN film when the film thickness of the LN film is in the range of about 1.6λ or lower as compared with the case of a 0th order surface acoustic wave.

Over the range of range of the film thickness of the LN film of about 1.6λ or lower, an acoustic velocity of about 4,500 m/second or more is obtained in the case of the primary order surface acoustic wave, an acoustic velocity of about 4,800 m/second or more is obtained in the case of the secondary order surface acoustic wave, and an acoustic velocity of about 5,100 m/second or more is obtained in the case of the tertiary order surface acoustic wave.

In contrast, as is clear from FIG. 31, it was discovered that the electromechanical coupling coefficient $k^2$ can be increased to about 0.1 or more over the range of the film thickness of the LN film of about 0.1λ or more and about 1.6λ or lower when the primary order surface acoustic wave is used. Moreover, it was discovered that when the secondary order surface acoustic wave is used, the electromechanical coupling coefficient $k^2$ can be increased to about 0.04 or more by adjusting the film thickness of the LN film in the range of about 0.5λ or more and about 1.6λ or lower. It was discovered that when the tertiary order surface acoustic wave is used, the electromechanical coupling coefficient $k^2$ can be increased to about 0.03 or more by adjusting the film thickness of the LN film in the range of about 0.6λ or more and about 1.6λ or lower.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device, comprising:
a piezoelectric substrate including an R-plane, a-plane, or m-plane sapphire substrate; and
a (90°, 90°, −15° to 15°) $LiNbO_3$ film in terms of Euler angles (φ, θ, Ψ) disposed on the sapphire substrate; and
electrodes disposed on the piezoelectric substrate and made of metal.

2. The surface acoustic wave device according to claim 1, wherein a primary order mode of a surface acoustic wave is utilized, and when a wavelength of the surface acoustic wave is defined as λ, the $LiNbO_3$ film thickness is in a range of about 0.1λ to about 1.6λ when the Euler angle Ψ is about −5° or more and about +5° or lower and is in a range of about 0.18λ to about 0.75λ when Ψ is about −15° or more and lower than about −5° or larger than about +5° and about +15° or lower.

3. The surface acoustic wave device according to claim 1, wherein a secondary order mode of a surface acoustic wave is utilized, and when a wavelength of the surface acoustic wave is defined as λ, the $LiNbO_3$ film thickness is in a range of about 0.4λ to about 1.6λ when the Euler angle Ψ is about −5° to about 5°.

4. The surface acoustic wave device according to claim 1, wherein a tertiary order mode of a surface acoustic wave is utilized, and when a wavelength of the surface acoustic wave is defined as λ, the $LiNbO_3$ film thickness is in a range of about 0.6λ to about 1.6λ when the Euler angle Ψ is about −5° to about 5°.

5. The surface acoustic wave device according to claim 1, wherein the electrodes are made of Al, and when a wavelength of surface acoustic waves is defined as λ, a thickness of the electrodes made of Al is in a range of about 0.02λ to about 0.16λ.

6. The surface acoustic wave device according to claim 5, wherein a metallization ratio of the electrodes is in a range of about 0.2 to about 0.7.

7. A surface acoustic wave device, comprising:
a piezoelectric substrate including an R-plane, a-plane, or m-plane sapphire substrate; and
a (0°, 90°, −15° to 15°) $LiNbO_3$ film in terms of Euler angles (φ, θ, Ψ) disposed on the sapphire substrate; and
electrodes disposed on the piezoelectric substrate and made of metal.

8. The surface acoustic wave device according to claim 7, wherein a primary order mode of a surface acoustic wave is utilized, and when a wavelength of surface acoustic wave is defined as λ, the $LiNbO_3$ film thickness is in a range of about 0.1λ to about 1.6λ when the Euler angle Ψ is about −5° or more and about +5° or lower and is in a range of about 0.17λ to about 0.8λ when Ψ is about −15° or more and lower than about −5° or larger than about +5° and about +15° or lower.

9. The surface acoustic wave device according to claim 7, wherein a secondary order mode of a surface acoustic wave is utilized, and when a wavelength of the surface acoustic wave is defined as λ, the $LiNbO_3$ film thickness is in a range of about 0.4λ to about 1.6λ when the Euler angle Ψ is about −5° to about 5°.

10. The surface acoustic wave device according to claim 7, wherein a tertiary order mode of a surface acoustic wave is utilized, and when a wavelength of the surface acoustic wave is defined as λ, the $LiNbO_3$ film thickness is in a range of about 0.6λ to about 1.0λ when the Euler angle Ψ is about −5° to about 5°.

11. The surface acoustic wave device according to claim 7, wherein the electrodes are made of Al, and when a wavelength of the surface acoustic waves is defined as λ, a thickness of the electrodes made of Al is in a range of about 0.02λ to about 0.16λ.

12. The surface acoustic wave device according to claim 11, wherein a metallization ratio of the electrodes is in a range of about 0.2 to about 0.7.

13. The surface acoustic wave device according to claim 1, wherein a primary order mode of a surface acoustic wave is utilized, and the piezoelectric substrate includes a short circuit electrode between the R-plane, a-plane, or m-plane sapphire substrate and the $LiNbO_3$ film.

14. The surface acoustic wave device according to claim 13, wherein when a wavelength of the surface acoustic wave is defined as λ, the $LiNbO_3$ film thickness is in a range of about 0.15λ to about 1.6λ.

15. The surface acoustic wave device according to claim 1, wherein a secondary order mode of a surface acoustic wave is utilized, and the piezoelectric substrate includes a short circuit electrode between the R-plane, a-plane, or m-plane sapphire substrate and the $LiNbO_3$ film.

16. The surface acoustic wave device according to claim 15, wherein when a wavelength of the surface acoustic wave is defined as λ, the $LiNbO_3$ film thickness is in a range of about 0.4λ to about 1.6λ.

17. The surface acoustic wave device according to claim 15, wherein when a wavelength of the surface acoustic wave is defined as λ, the $LiNbO_3$ film thickness is in a range of about 0.6λ to about 1.6λ.

* * * * *